(12) United States Patent
Sekine et al.

(10) Patent No.: US 8,253,189 B2
(45) Date of Patent: Aug. 28, 2012

(54) SEMICONDUCTOR DEVICE AND METHOD FOR MANUFACTURING THE SAME

(75) Inventors: Katsuyuki Sekine, Yokohama (JP);
Akiko Sekihara, Yokohama (JP);
Kensuke Takano, Yokohama (JP);
Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 459 days.

(21) Appl. No.: 12/510,577

(22) Filed: Jul. 28, 2009

(65) Prior Publication Data

US 2010/0019312 A1  Jan. 28, 2010

(30) Foreign Application Priority Data

Jul. 28, 2008  (JP) ................... 2008-193922

(51) Int. Cl.
*H01L 29/66* (2006.01)
(52) U.S. Cl. ................ 257/325; 257/E29.309
(58) Field of Classification Search .............. 257/324, 257/325, E29.309, E21.423
See application file for complete search history.

(56) References Cited

U.S. PATENT DOCUMENTS

| | | | | |
|---|---|---|---|---|
| 5,698,464 | A | * | 12/1997 | Tsunoda ........................ 438/4 |
| 2005/0285180 | A1 | | 12/2005 | Mitani et al. |
| 2006/0202252 | A1 | * | 9/2006 | Wang et al. ................ 257/314 |
| 2006/0281260 | A1 | * | 12/2006 | Lue ............................. 438/264 |
| 2007/0018231 | A1 | | 1/2007 | Mitani et al. |
| 2007/0120179 | A1 | * | 5/2007 | Park et al. .................. 257/324 |
| 2008/0305647 | A1 | * | 12/2008 | Matsushita et al. .......... 438/791 |
| 2009/0321809 | A1 | * | 12/2009 | Ramaswamy et al. ....... 257/321 |
| 2010/0193859 | A1 | * | 8/2010 | Lai et al. .................... 257/325 |
| 2010/0283097 | A1 | * | 11/2010 | Endoh et al. ............... 257/324 |

FOREIGN PATENT DOCUMENTS

| | | |
|---|---|---|
| JP | 2004-158810 | 6/2004 |
| JP | 2006-216215 | 8/2006 |
| WO | WO 2008156215 A1 * | 12/2008 |

* cited by examiner

*Primary Examiner* — Matthew Landau
*Assistant Examiner* — Joseph C Nicely
(74) *Attorney, Agent, or Firm* — Finnegan, Henderson, Farabow, Garrett & Dunner, L.L.P.

(57) ABSTRACT

A semiconductor device includes a semiconductor region, a tunnel insulating film formed on a surface of the semiconductor region, a charge-storage insulating film formed on a surface of the tunnel insulating film and containing silicon and nitrogen, a block insulating film formed on a surface of the charge-storage insulating film, and a control gate electrode formed on a surface of the block insulating film, wherein the tunnel insulating film has a first insulating film formed on the surface of the semiconductor region and containing silicon and oxygen, a second insulating film formed on a surface of the first insulating film, and a third insulating film formed on a surface of the second insulating film and containing silicon and oxygen, and a charge trap state in the second insulating film has a lower density than that in the charge-storage insulating film.

1 Claim, 34 Drawing Sheets

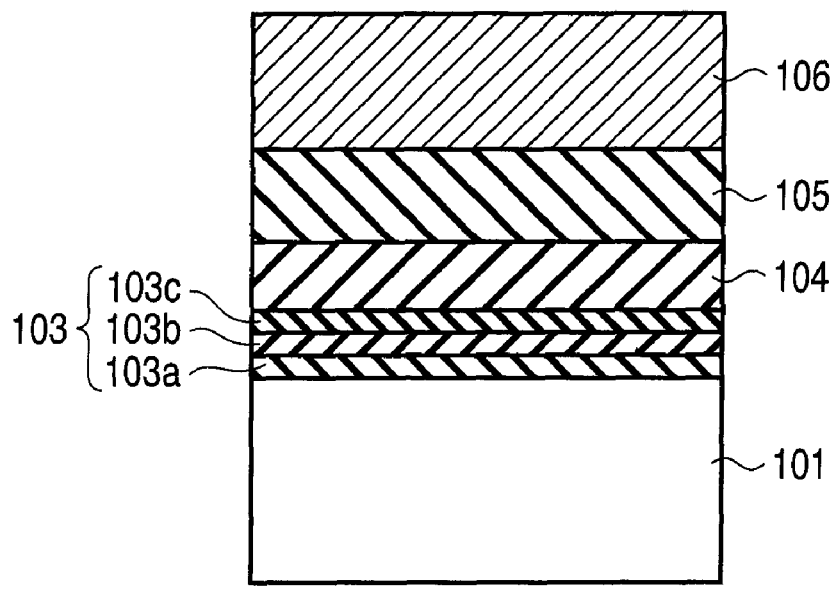
F I G. 7
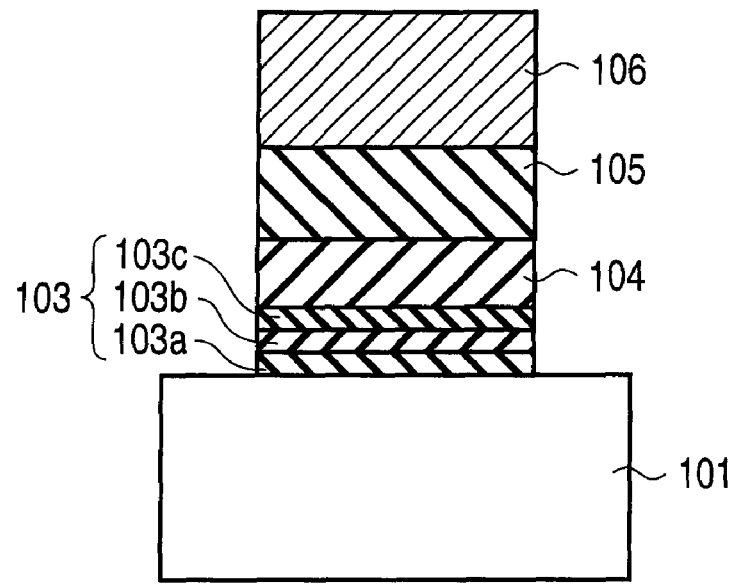
F I G. 8

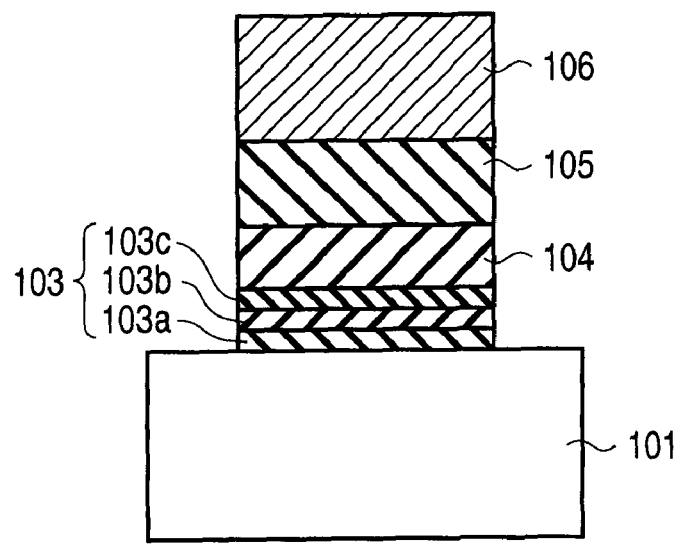
F I G. 1 5
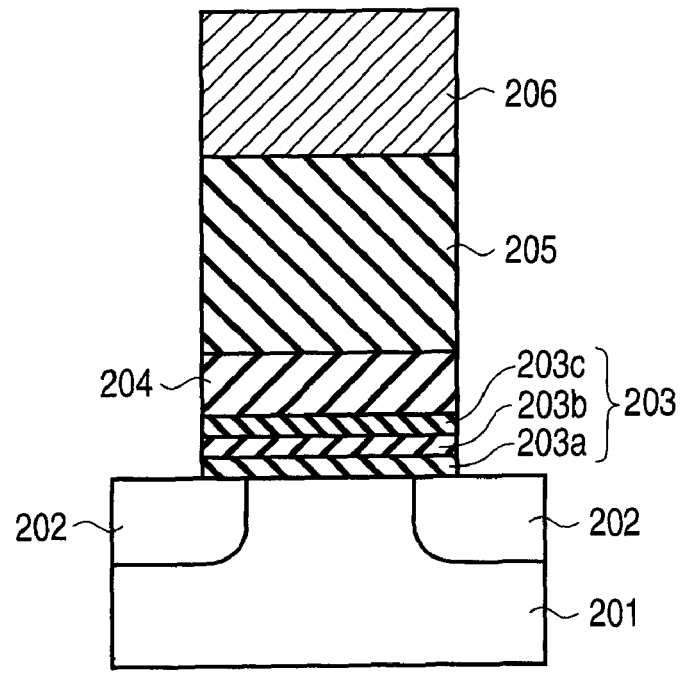
F I G. 1 6

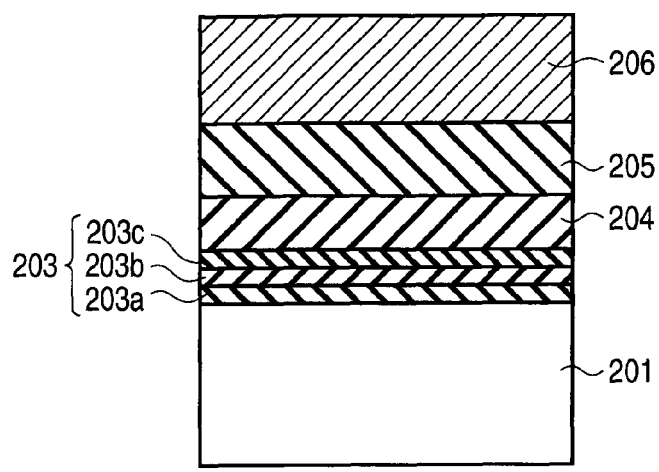
F I G. 2 2
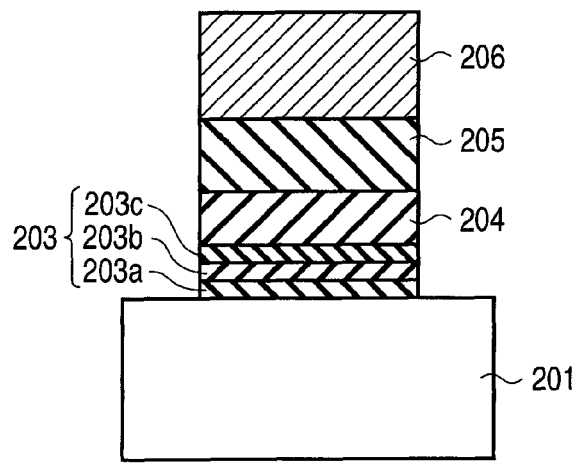
F I G. 2 3
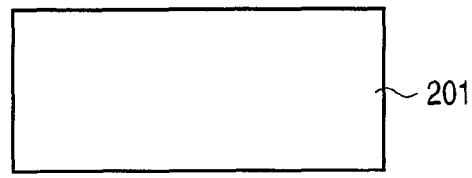
F I G. 2 4

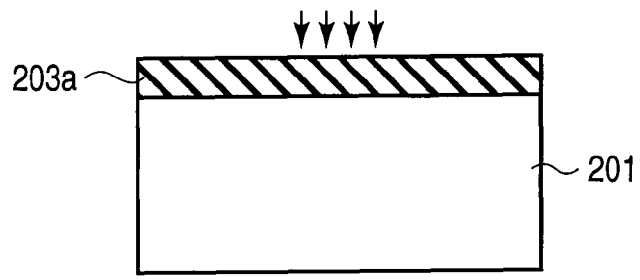
F I G. 2 5
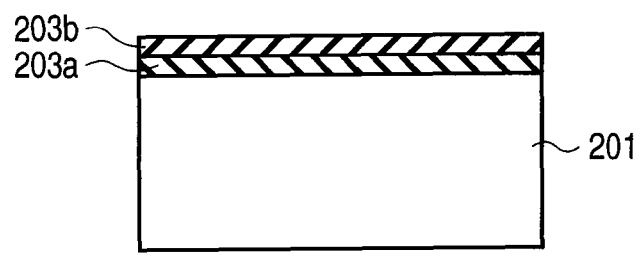
F I G. 2 6
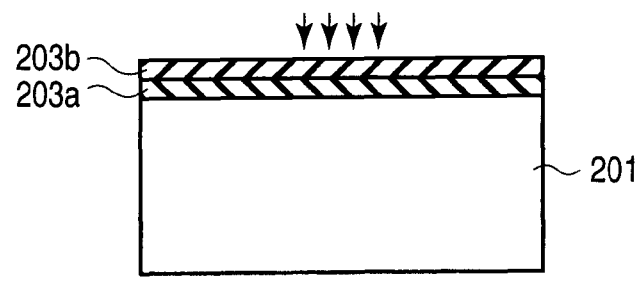
F I G. 2 7

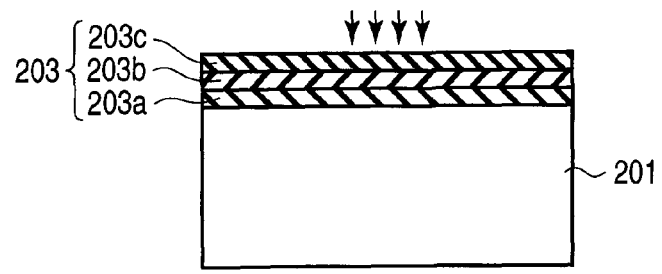
F I G. 28
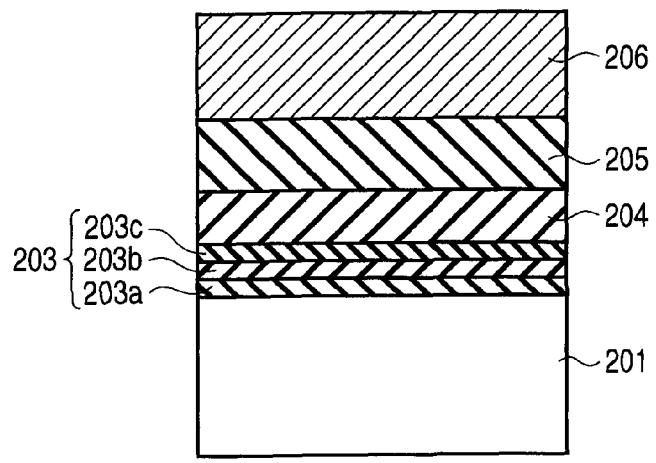
F I G. 29
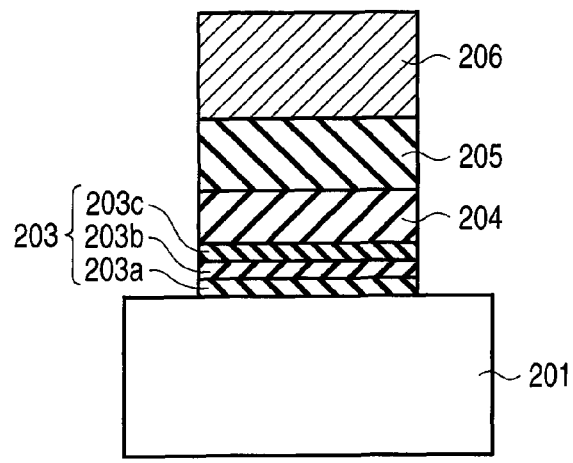
F I G. 30

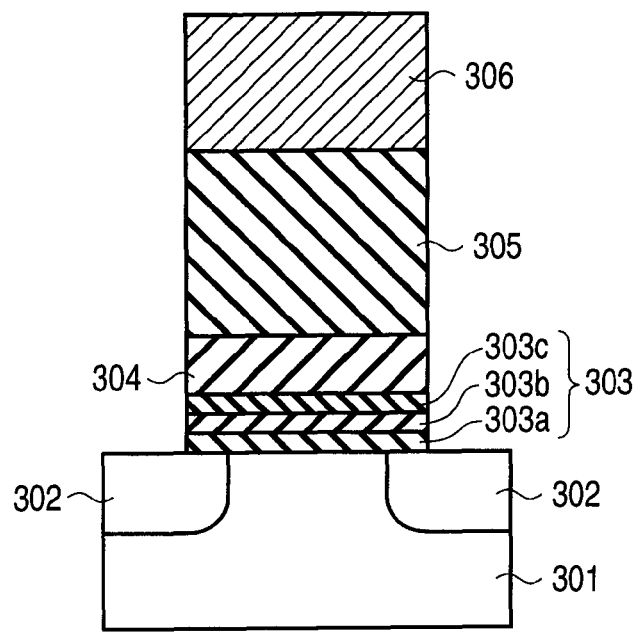
F I G. 31
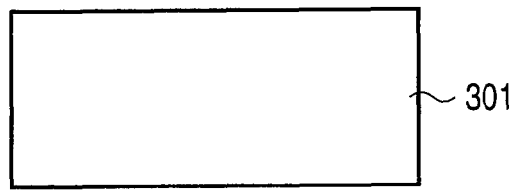
F I G. 32
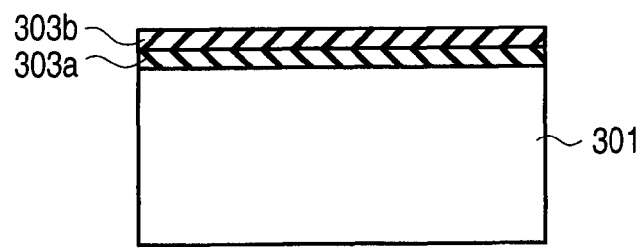
F I G. 33

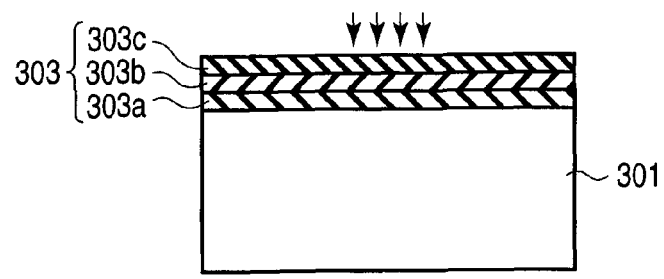
F I G. 34
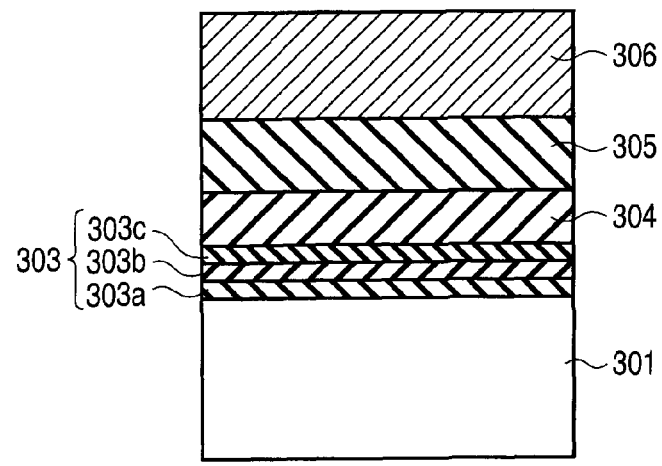
F I G. 35
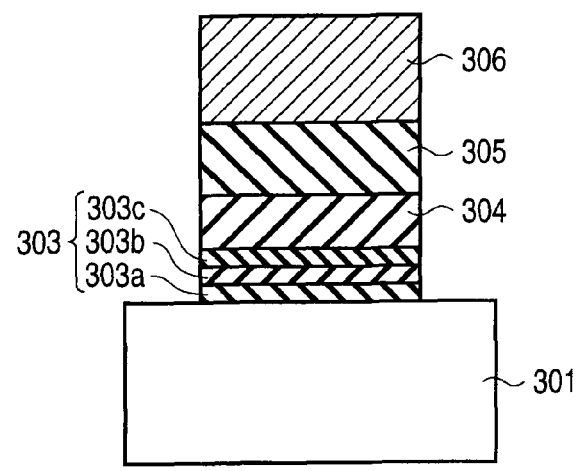
F I G. 36

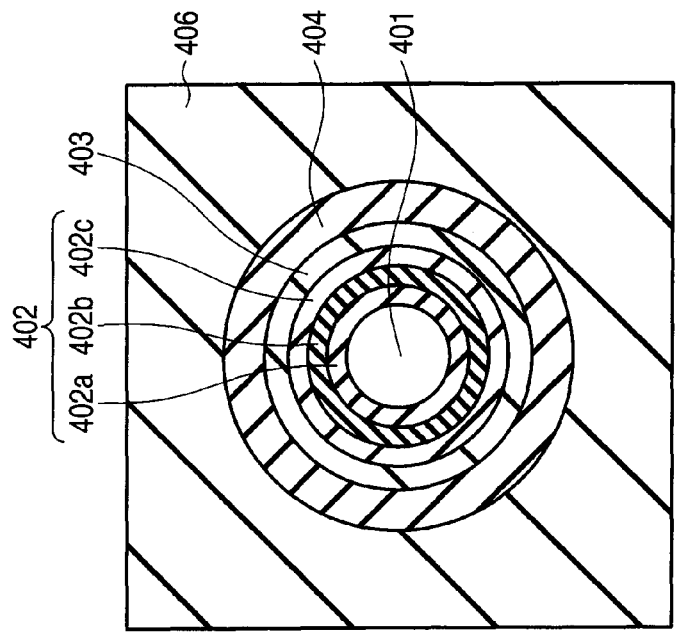
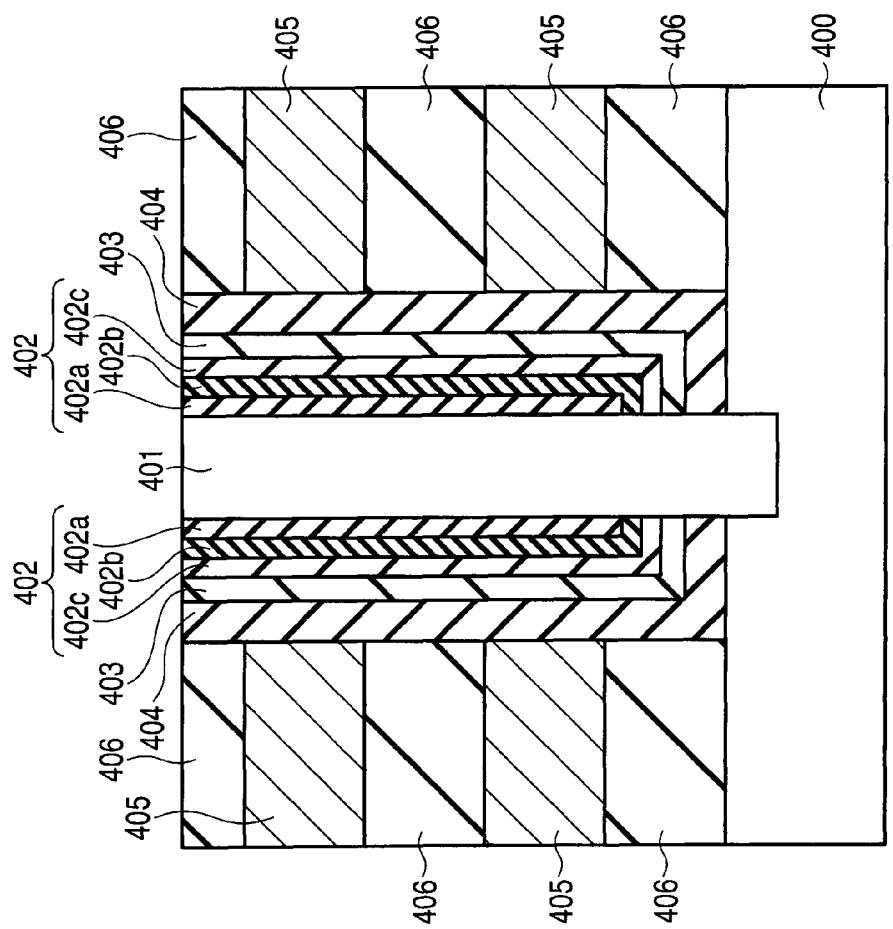

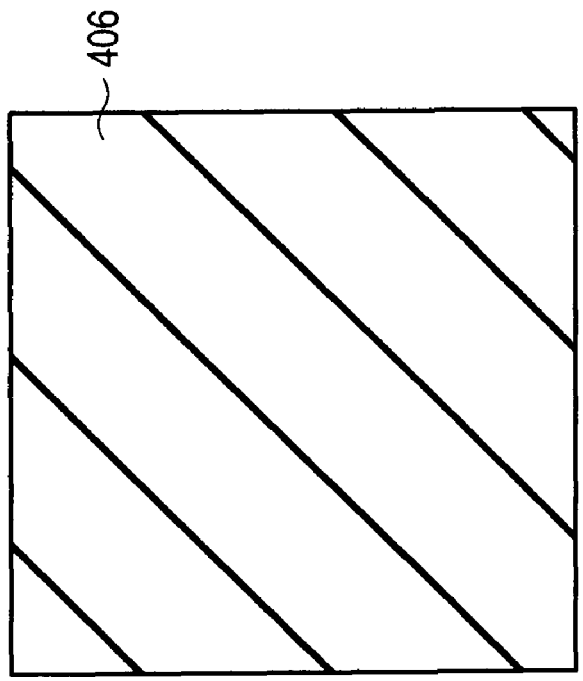
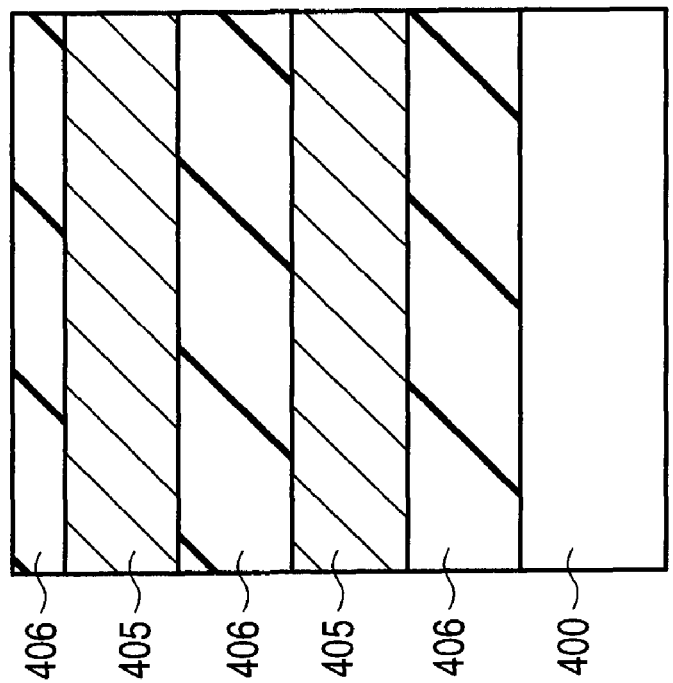

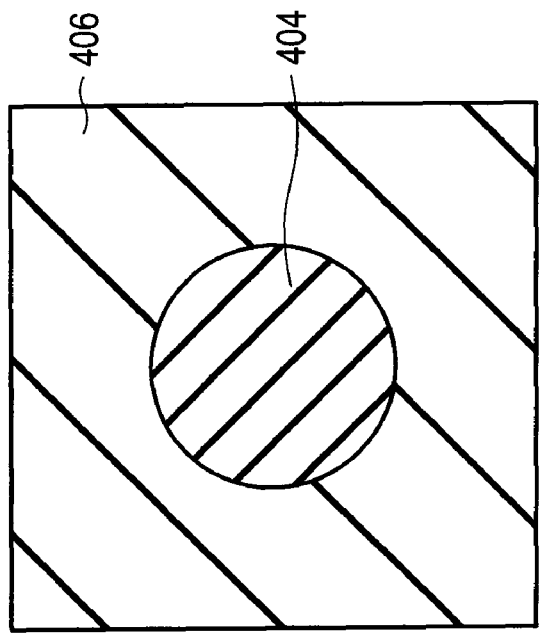
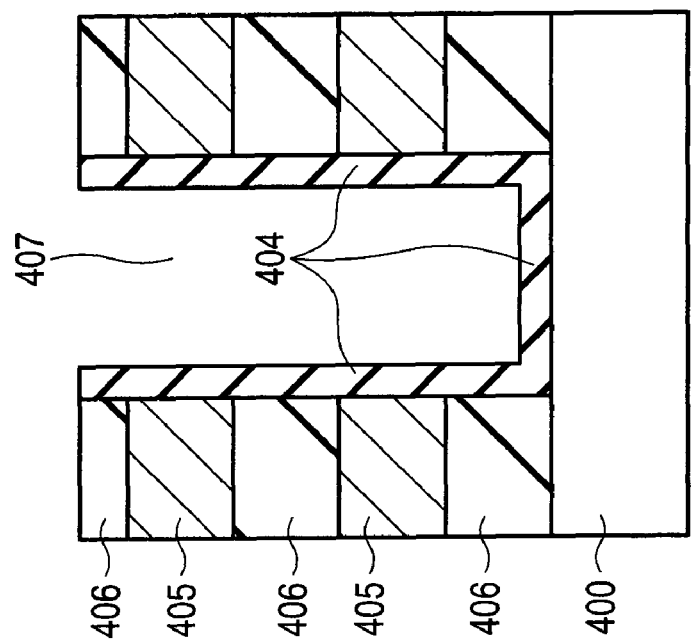
FIG. 39B
FIG. 39A

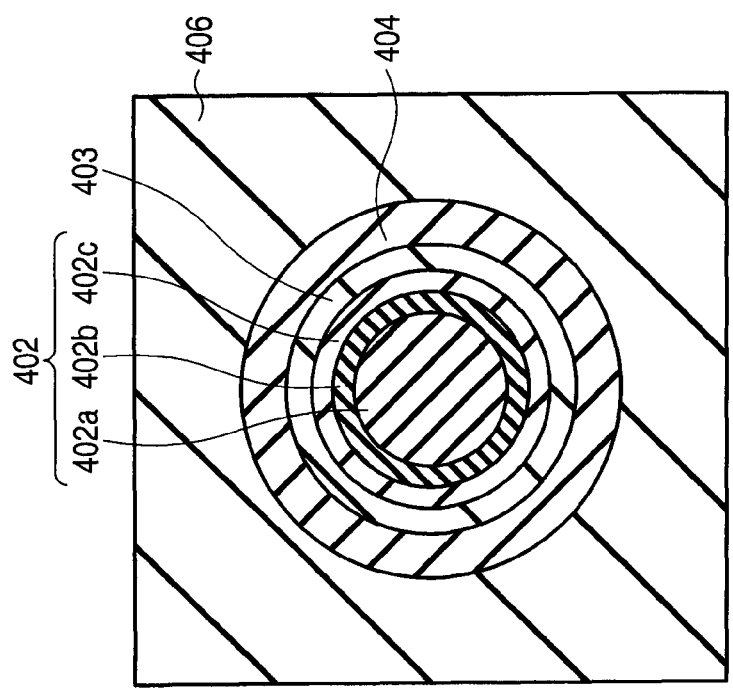
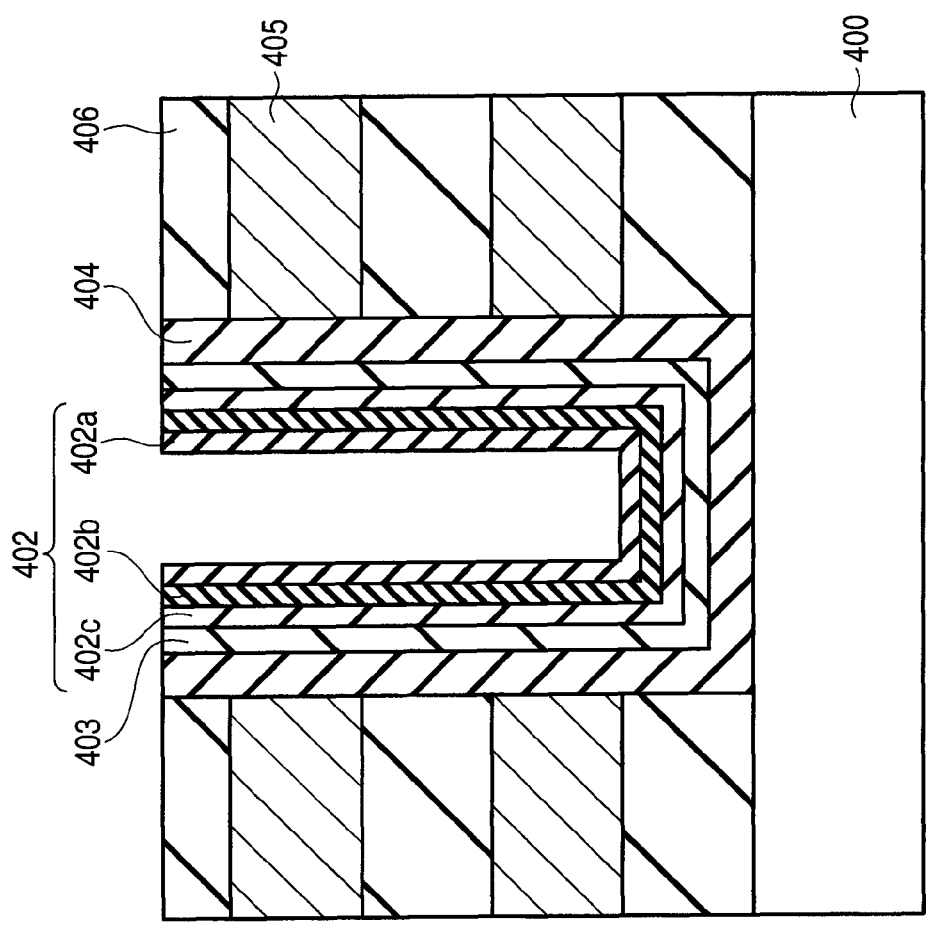
FIG. 40B
FIG. 40A

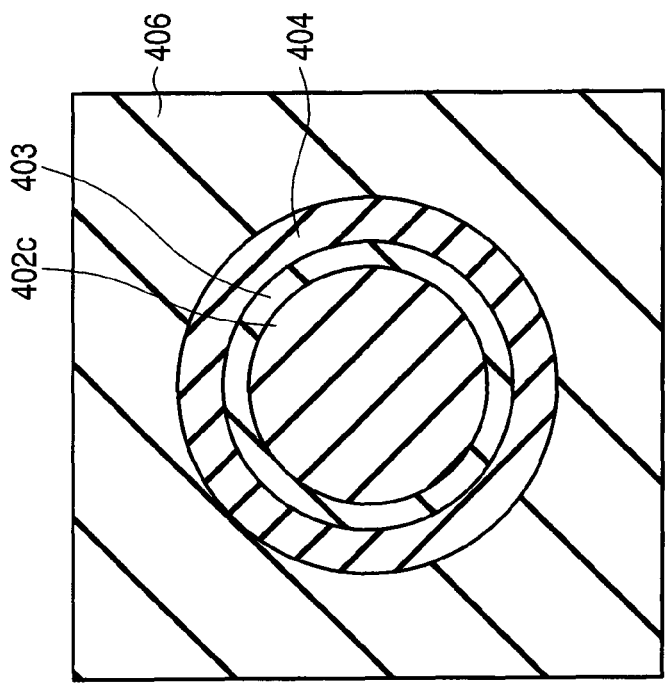
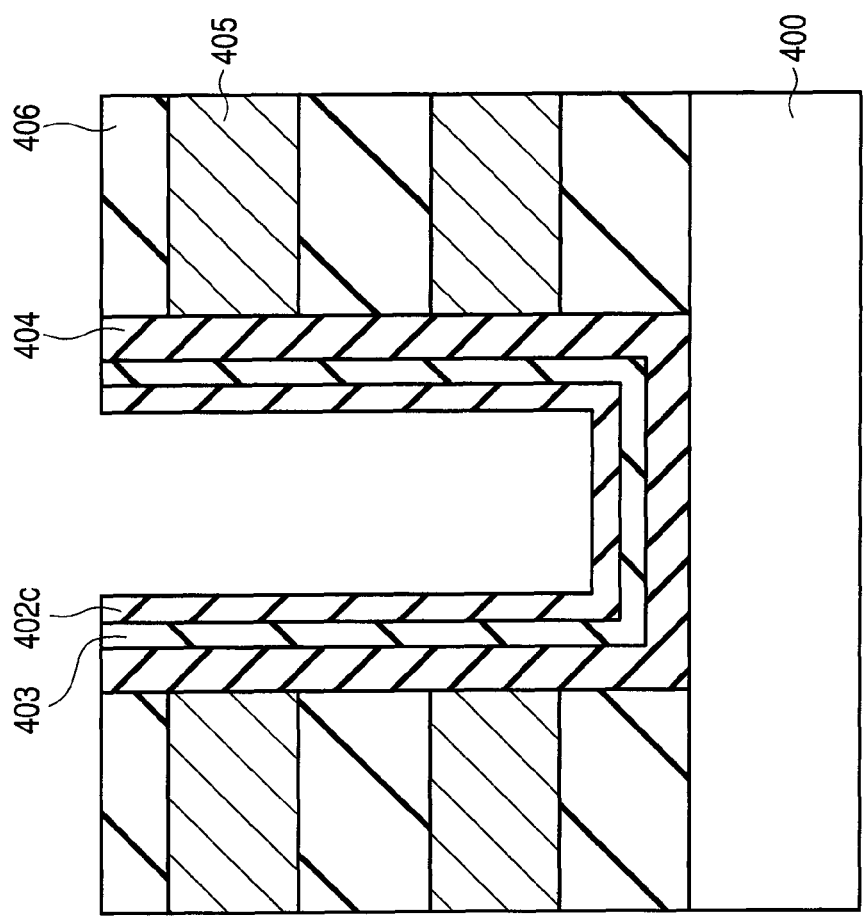

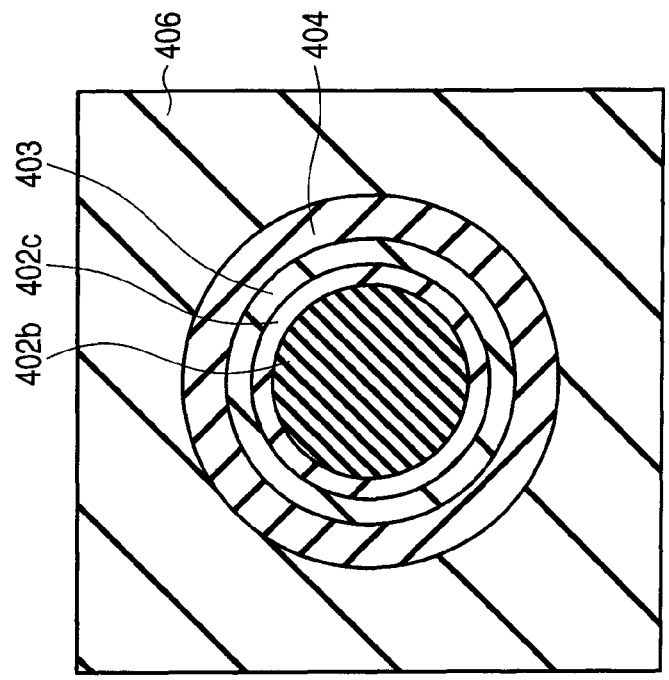
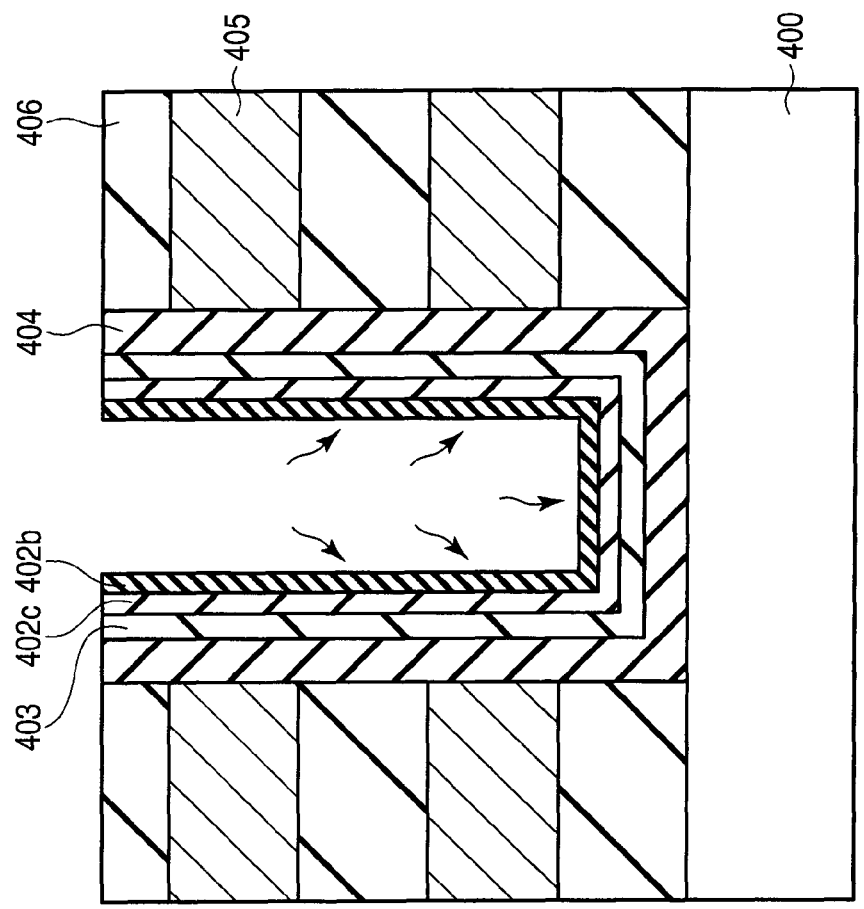
FIG. 44A
FIG. 44B

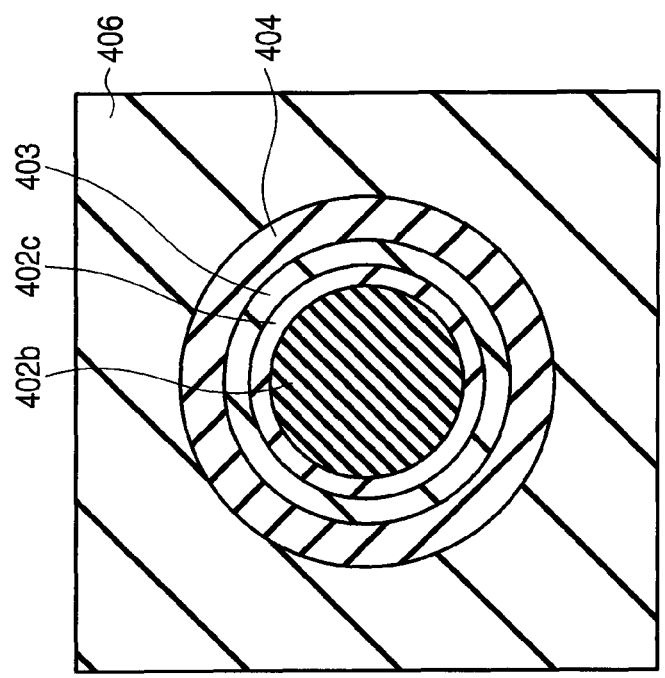
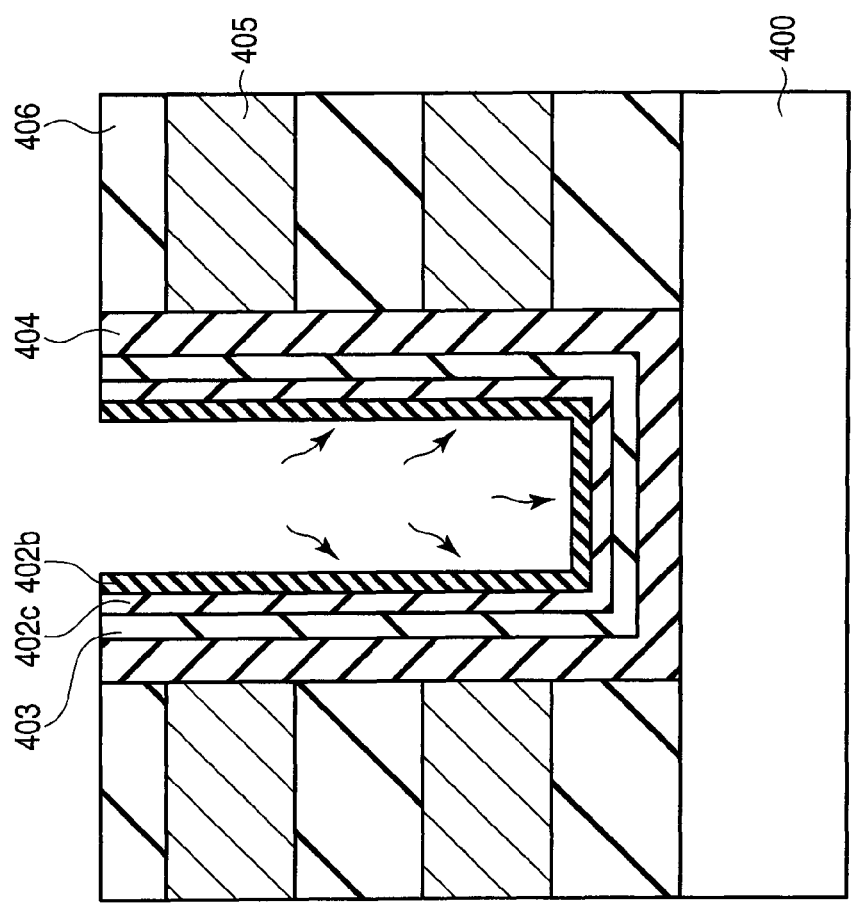
FIG. 45B
FIG. 45A

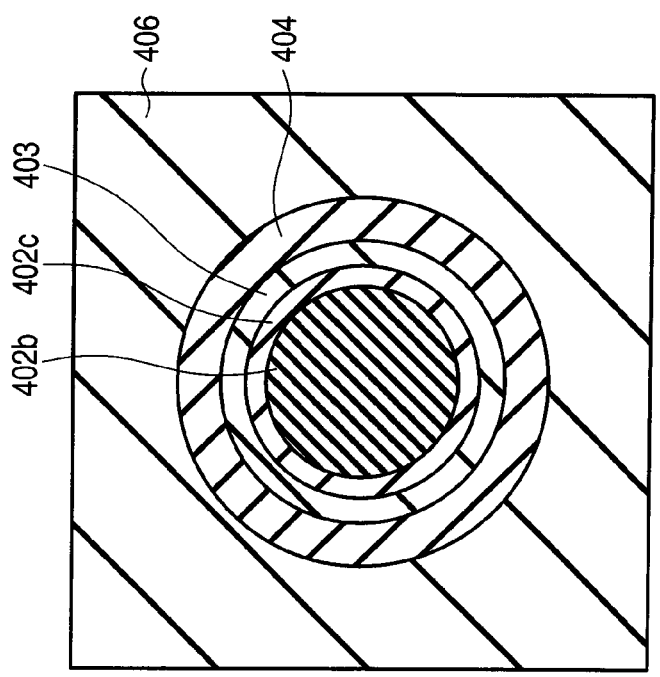
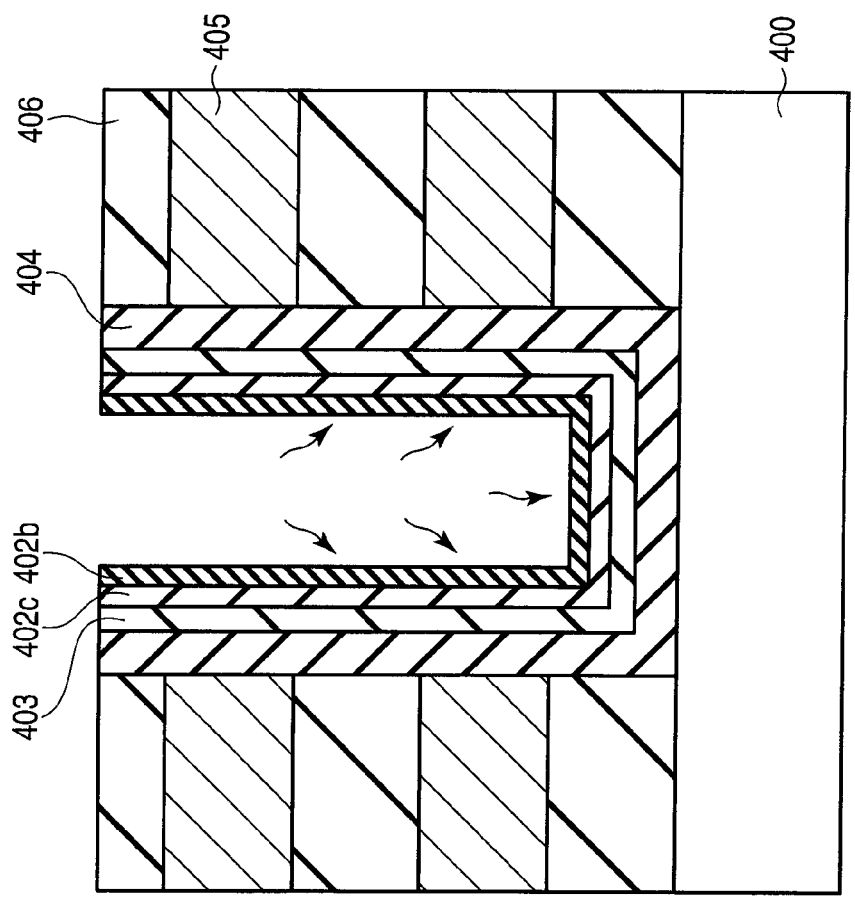
FIG. 47B
FIG. 47A

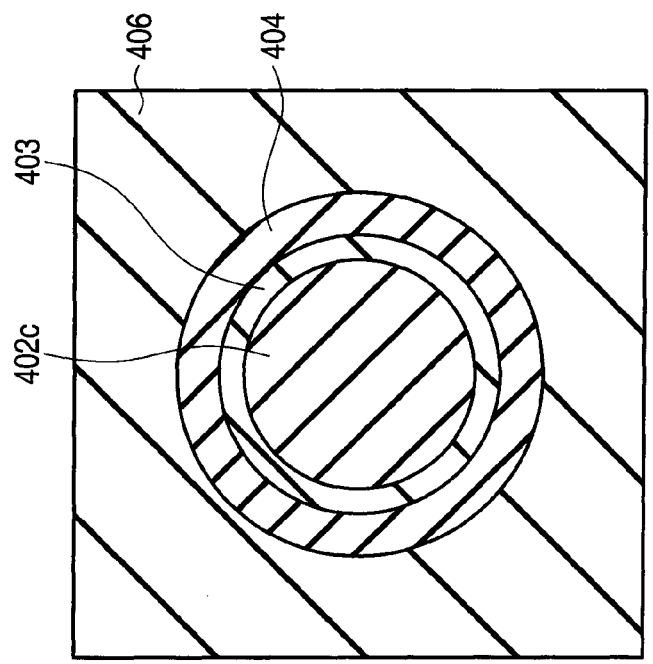
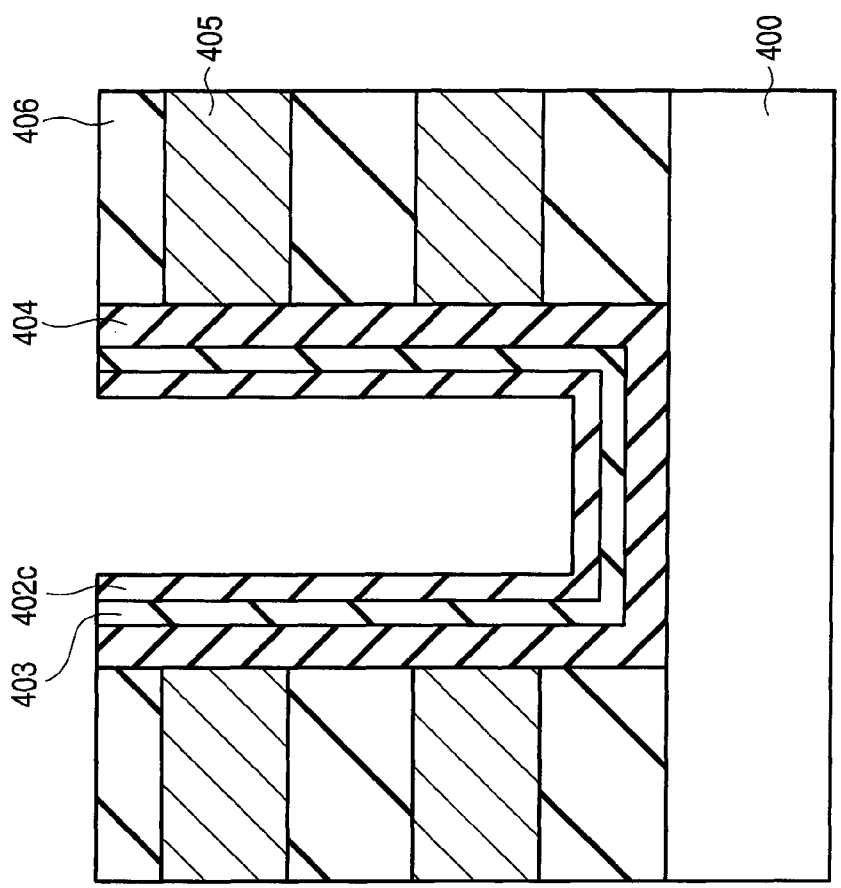
FIG. 49B
FIG. 49A

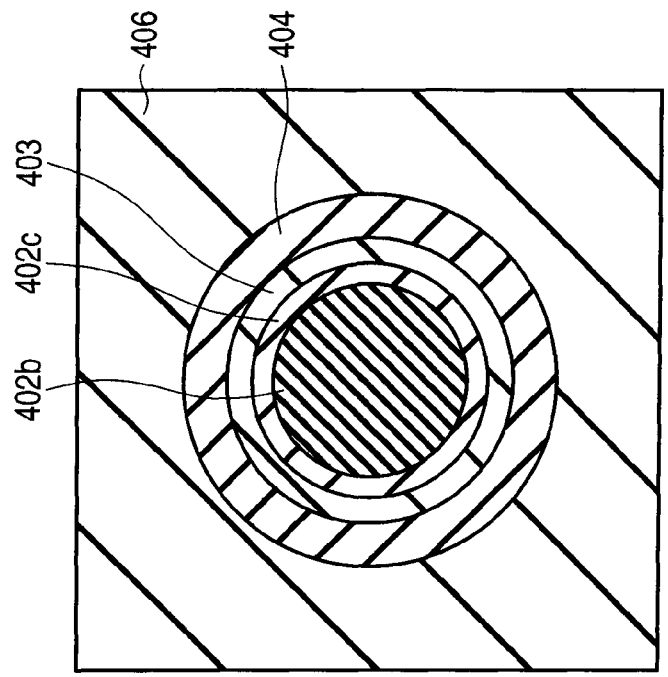
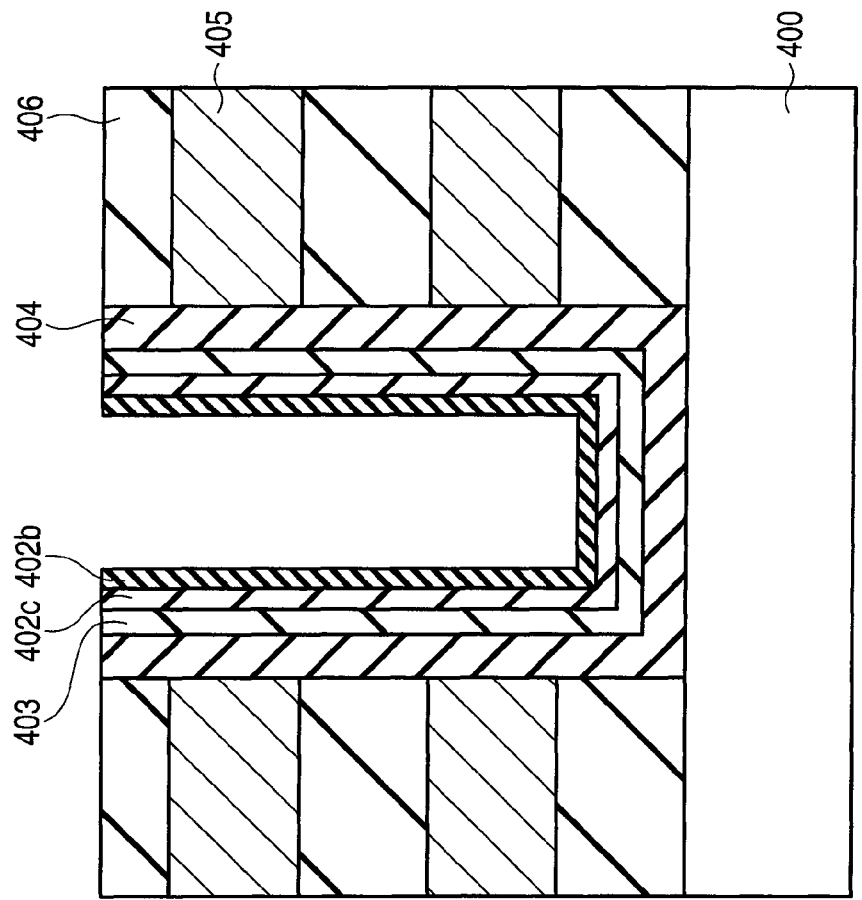
FIG. 53B
FIG. 53A

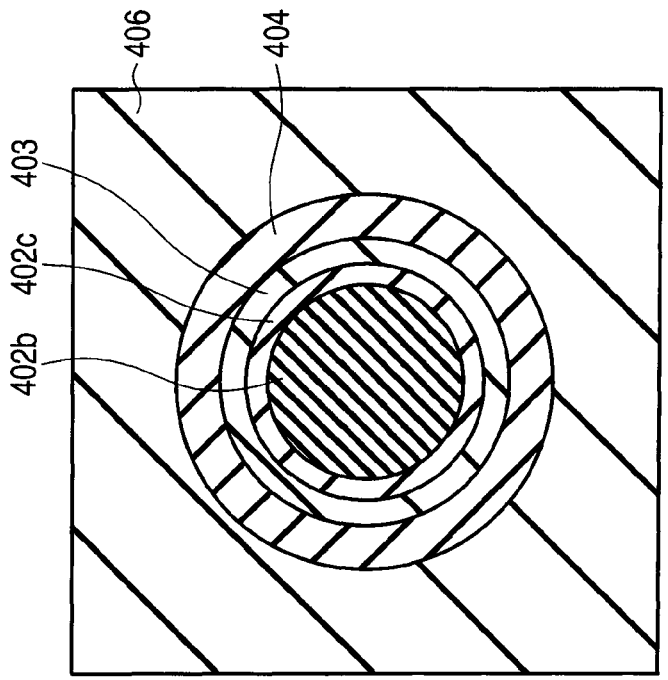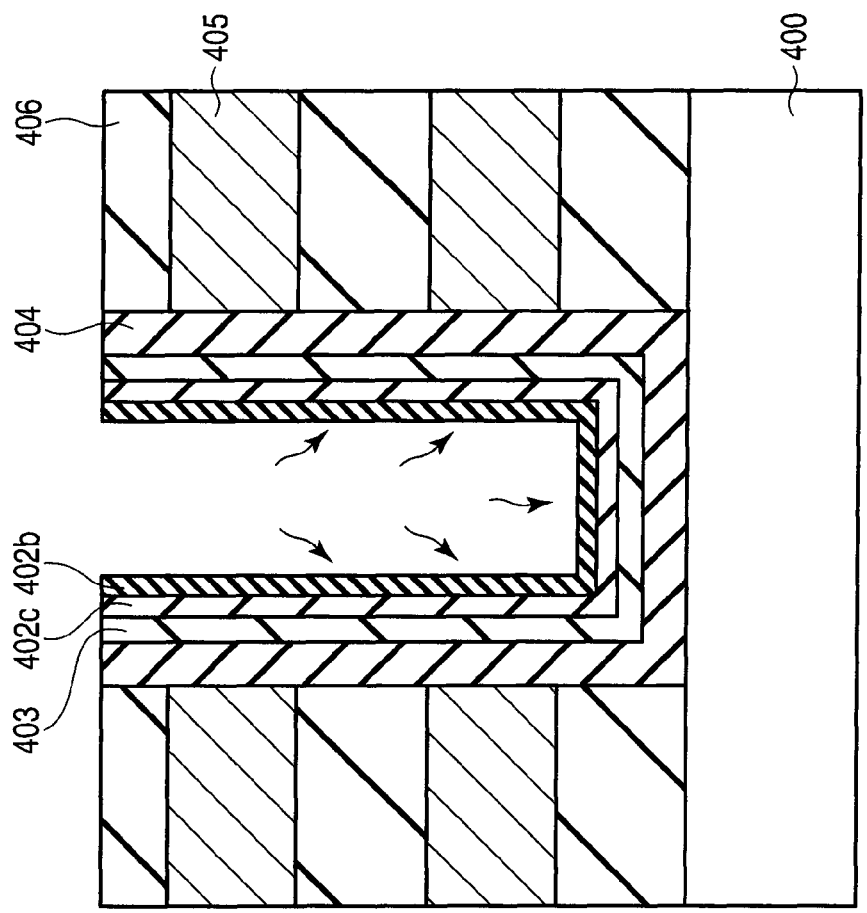
FIG. 54B
FIG. 54A

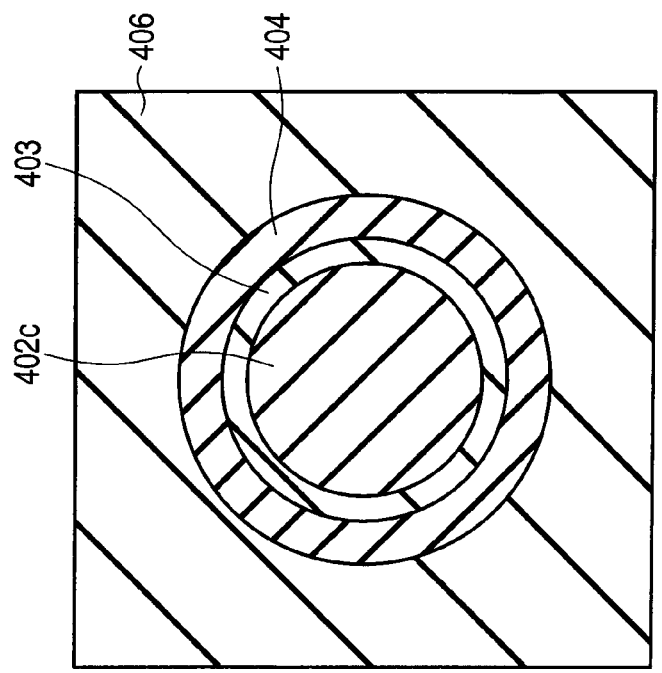
F I G. 55 B
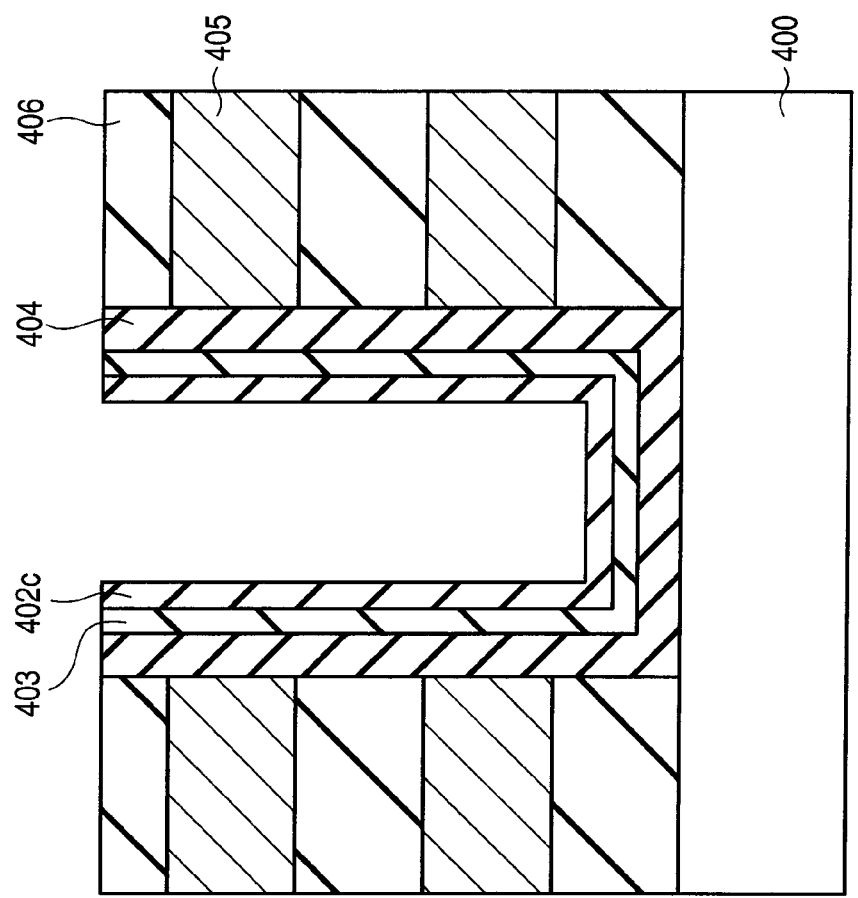
F I G. 55 A

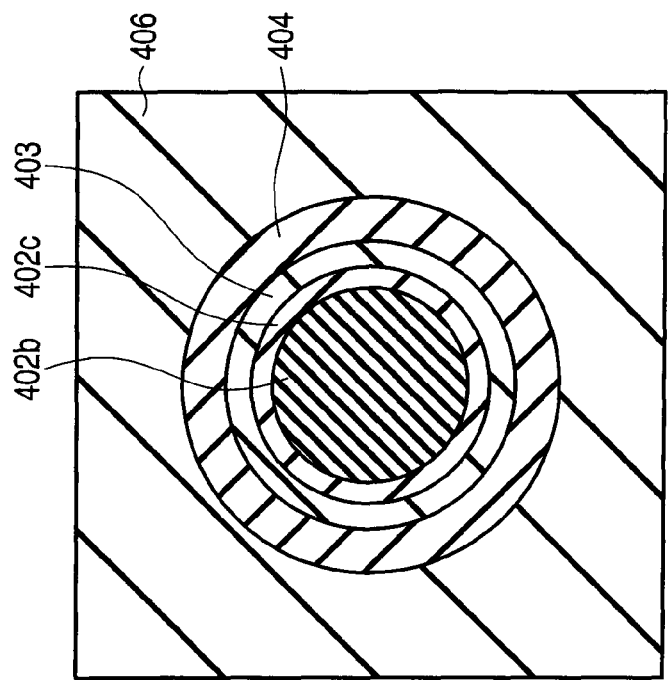
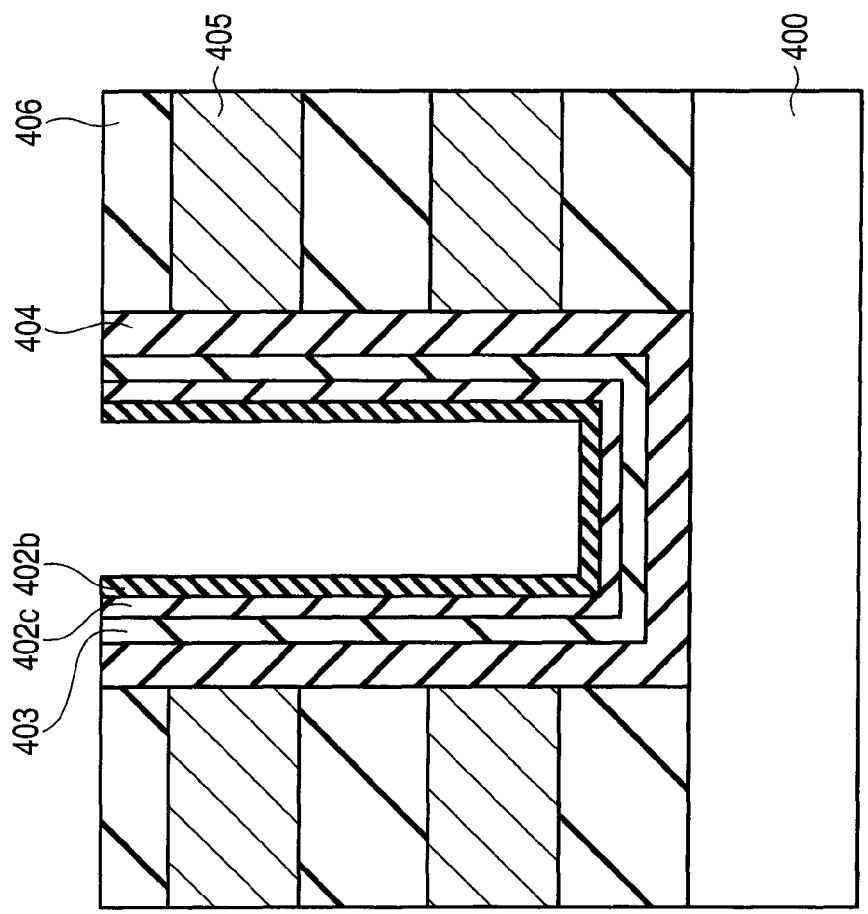
F I G. 56B
F I G. 56A

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2008-193922, filed Jul. 28, 2008, the entire contents of which are incorporated herein by reference.

BACKGROUND OF THE INVENTION

1. Field of the Invention

The present invention relates to a semiconductor device and a method for manufacturing the semiconductor device.

2. Description of the Related Art

Nonvolatile semiconductor memory devices using, as a charge-storage layer, a charge-storage insulating film in which charges can be trapped have been proposed (see, for example, Jpn. Pat. Appln. KOKAI Publication No. 2004-158810). The charge-trap nonvolatile semiconductor memory device traps charges injected into the charge-storage insulating film through a tunnel insulating film, in a trap state in the charge-storage insulating film. The charges are thus stored in the charge-storage insulating film. Known typical charge-trap nonvolatile semiconductor memory devices are of a MONOS or SONOS type.

To neutralize charges in the charge-trap nonvolatile semiconductor memory device, the erase characteristics need to be improved by effectively injecting holes into the charge-storage insulating film. Thus, a structure has been proposed which uses a stacked film of a silicon oxide film, a silicon nitride film, and a silicon oxide film as a tunnel insulating film (see, for example, Jpn. Pat. Appln. KOKAI Publication No. 2006-216215). However, the resulting tunnel insulating film may not be optimum.

BRIEF SUMMARY OF THE INVENTION

According to a first aspect of the present invention, there is provided a semiconductor device comprising: a semiconductor region; a tunnel insulating film formed on a surface of the semiconductor region; a charge-storage insulating film formed on a surface of the tunnel insulating film and containing silicon and nitrogen; a block insulating film formed on a surface of the charge-storage insulating film; and a control gate electrode formed on a surface of the block insulating film, wherein the tunnel insulating film has a first insulating film formed on the surface of the semiconductor region and containing silicon and oxygen, a second insulating film formed on a surface of the first insulating film, and a third insulating film formed on a surface of the second insulating film and containing silicon and oxygen, and a charge trap state in the second insulating film has a lower density than that in the charge-storage insulating film.

According to a second aspect of the present invention, there is provided a method for manufacturing a semiconductor device a tunnel insulating film formed on a surface of a semiconductor region, a charge-storage insulating film formed on a surface of the tunnel insulating film and containing silicon and nitrogen, a block insulating film formed on a surface of the charge-storage insulating film, and a control gate electrode formed on a surface of the block insulating film, wherein a process of manufacturing the tunnel insulating film comprises: forming a first insulating film containing silicon and oxygen on the surface of the semiconductor region; introducing nitrogen into an upper portion of the first insulating film to form a second insulating film containing silicon, nitrogen, and oxygen; and forming a third insulating film containing silicon and oxygen on a surface of the second insulating film.

According to a third aspect of the present invention, there is provided a method for manufacturing a semiconductor device comprising a tunnel insulating film formed on a surface of a semiconductor region, a charge-storage insulating film formed on a surface of the tunnel insulating film and containing silicon and nitrogen, a block insulating film formed on a surface of the charge-storage insulating film, and a control gate electrode formed on a surface of the block insulating film, the tunnel insulating film including a first insulating film formed on a surface of the semiconductor region and containing silicon and oxygen, a second insulating film formed on a surface of the first insulating film and containing silicon and nitrogen, and a third insulating film formed on a surface of the second insulating film and containing silicon and oxygen, wherein forming the second insulating film, the second insulating film is formed at a lower temperature than the charge-storage insulating film.

According to a fourth aspect of the present invention, there is provided a method for manufacturing a semiconductor device comprising a tunnel insulating film formed on a surface of a semiconductor region, a charge-storage insulating film formed on a surface of the tunnel insulating film and containing silicon and nitrogen, a block insulating film formed on a surface of the charge-storage insulating film, and a control gate electrode formed on a surface of the block insulating film, wherein a process of forming the tunnel insulating film comprises forming a third insulating film containing silicon and oxygen on an exposed surface of the charge-storage insulating film, introducing nitrogen into an exposed surface side region of the third insulating film to form a second insulating film containing silicon, nitrogen, and oxygen, and forming a first insulating film containing silicon and oxygen on an exposed surface of the second insulating film.

BRIEF DESCRIPTION OF THE SEVERAL VIEWS OF THE DRAWING

FIG. 7 is a sectional view schematically showing a part of the process of manufacturing the semiconductor device according to the first embodiment of the present invention;

FIG. 8 is a sectional view schematically showing a part of the process of manufacturing the semiconductor device according to the first embodiment of the present invention;

FIG. 15 is a sectional view schematically showing a part of the process of manufacturing the semiconductor device according to the modification of the first embodiment of the present invention;

FIG. 16 is a sectional view schematically showing the configuration of a semiconductor device according to a second embodiment of the present invention;

FIG. 22 is a sectional view schematically showing a part of the process of manufacturing the semiconductor device according to the second embodiment of the present invention;

FIG. 23 is a sectional view schematically showing a part of the process of manufacturing the semiconductor device according to the second embodiment of the present invention;

FIG. 24 is a sectional view schematically showing a part of a process of manufacturing a semiconductor device according to a modification of the second embodiment of the present invention;

FIG. 25 is a sectional view schematically showing a part of the process of manufacturing the semiconductor device according to the modification of the second embodiment of the present invention;

FIG. 26 is a sectional view schematically showing a part of the process of manufacturing the semiconductor device according to the modification of the second embodiment of the present invention;

FIG. 27 is a sectional view schematically showing a part of the process of manufacturing the semiconductor device according to the modification of the second embodiment of the present invention;

FIG. 28 is a sectional view schematically showing a part of the process of manufacturing the semiconductor device according to the modification of the second embodiment of the present invention;

FIG. 29 is a sectional view schematically showing a part of the process of manufacturing the semiconductor device according to the modification of the second embodiment of the present invention;

FIG. 30 is a sectional view schematically showing a part of the process of manufacturing the semiconductor device according to the modification of the second embodiment of the present invention;

FIG. 31 is a sectional view schematically showing the configuration of a semiconductor device according to a third embodiment of the present invention;

FIG. 32 is a sectional view schematically showing a part of a process of manufacturing a semiconductor device according to the third embodiment of the present invention;

FIG. 33 is a sectional view schematically showing a part of the process of manufacturing the semiconductor device according to the third embodiment of the present invention;

FIG. 34 is a sectional view schematically showing a part of the process of manufacturing the semiconductor device according to the third embodiment of the present invention;

FIG. 35 is a sectional view schematically showing a part of the process of manufacturing the semiconductor device according to the third embodiment of the present invention;

FIG. 36 is a sectional view schematically showing a part of the process of manufacturing the semiconductor device according to the third embodiment of the present invention;

FIGS. 37A and 37B are diagrams schematically showing the configuration of a semiconductor device according to a fourth embodiment of the present invention;

FIGS. 38A and 38B are diagrams schematically showing a part of a process of manufacturing a semiconductor device according to the fourth embodiment of the present invention;

FIGS. 39A and 39B are diagrams schematically showing a part of the process of manufacturing the semiconductor device according to the fourth embodiment of the present invention;

FIGS. 40A and 40B are diagrams schematically showing a part of the process of manufacturing the semiconductor device according to the fourth embodiment of the present invention;

FIGS. 43A and 43B are diagrams schematically showing a part of a process of manufacturing a tunnel insulating film in the semiconductor device according to the fourth embodiment of the present invention;

FIGS. 44A and 44B are diagrams schematically showing a part of the process of manufacturing the tunnel insulating film in the semiconductor device according to the fourth embodiment of the present invention;

FIGS. 45A and 45B are diagrams schematically showing a part of the process of manufacturing the tunnel insulating film in the semiconductor device according to the fourth embodiment of the present invention;

FIGS. 47A and 47B are diagrams schematically showing a part of the process of manufacturing the tunnel insulating film in the semiconductor device according to the fourth embodiment of the present invention;

FIGS. 49A and 49B are diagrams schematically showing a part of the process of manufacturing the tunnel insulating film in the semiconductor device according to the fourth embodiment of the present invention;

FIGS. 53A and 53B are diagrams schematically showing a part of the process of manufacturing the tunnel insulating film in the semiconductor device according to the fourth embodiment of the present invention;

FIGS. 54A and 54B are diagrams schematically showing a part of the process of manufacturing the tunnel insulating film in the semiconductor device according to the fourth embodiment of the present invention;

FIGS. 55A and 55B are diagrams schematically showing a part of the process of manufacturing the tunnel insulating film in the semiconductor device according to the fourth embodiment of the present invention; and FIGS. 56A and 56B are diagrams schematically showing a part of the process of manufacturing the tunnel insulating film in the semiconductor device according to the fourth embodiment of the present invention.

DETAILED DESCRIPTION OF THE INVENTION

Embodiments of the present invention will be described below with reference to the drawings.

First Embodiment

Figure 1:
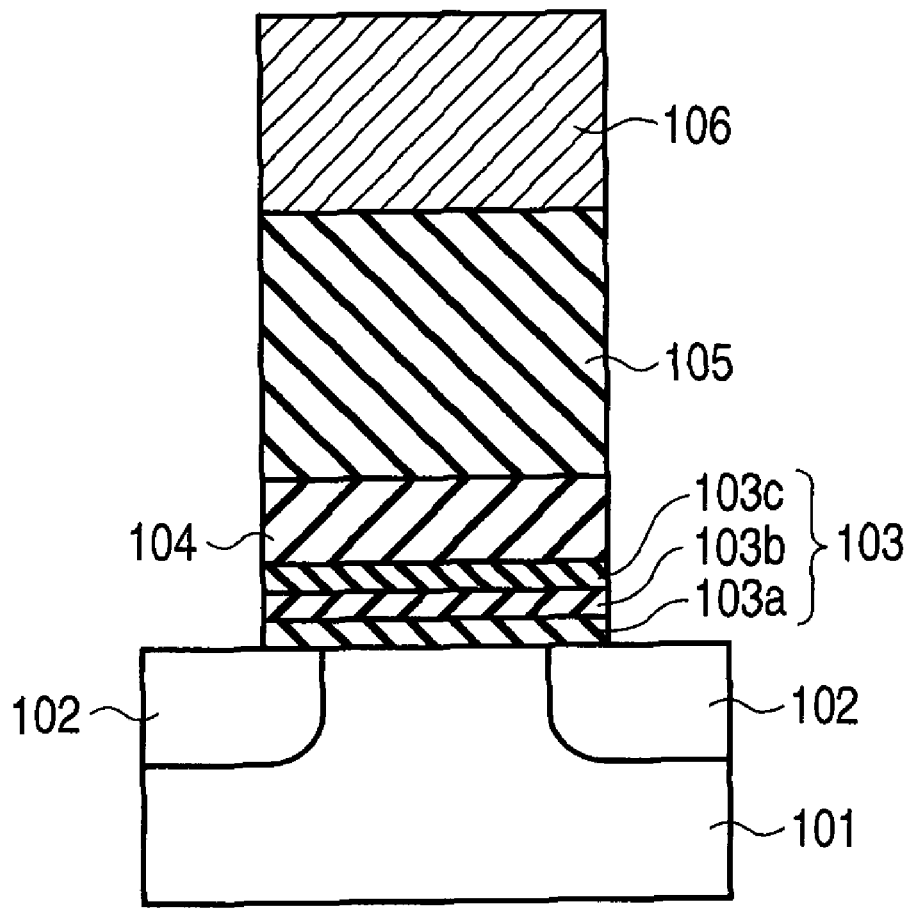
FIG. 1 is a sectional view schematically showing the configuration of a semiconductor device according to a first embodiment of the present invention.

FIG. 1 is a sectional view schematically showing the basic structure of a semiconductor device according to the present invention; the sectional view is taken along a bit line direction (channel length direction).

First, the configuration of the present embodiment will be described with reference to FIG. 1.

As shown in FIG. 1, an element region with a source/drain region 102 is formed in a semiconductor substrate (silicon substrate) 101. A tunnel insulating film 103 is formed on the element region. A charge-storage insulating film 104 is formed on the tunnel insulating film 103. A block insulating film 105 is formed on the charge-storage insulating film 104. A control gate electrode 106 is formed on the block insulating film 105.

The tunnel insulating film 103 has a lower insulating film 103a containing silicon and oxygen, an intermediate insulating film 103b formed on the lower insulating film 103a and containing silicon, nitrogen, and oxygen, and an upper insulating film 103c formed on the intermediate insulating film 103b and containing silicon and oxygen. Specifically, the tunnel insulating film 103 has the lower insulating film 103a formed of a silicon oxide film and having a thickness of about 1 to 2 nm, the intermediate insulating film 103b formed of a silicon nitride film (for example, silicon oxynitride film) containing oxygen and having a thickness of about 1 to 3 nm, and the upper insulating film 103c formed of a silicon oxide film and having a thickness of about 1 to 4 nm.

The charge-storage insulating film 104 is formed of a silicon nitride film of thickness about 2 to 5 nm. The block insulating film 105 is formed of a silicon oxide film or a high-dielectric-constant insulating film of thickness about 10 to 25 nm. The high-dielectric-constant insulating film is, for example, alumina ($Al_2O_3$), which exhibits a large band gap. The control gate electrode 106 is formed of polysilicon or a metal material. The metal material is desirably metal with a high work function.

In the present embodiment, the intermediate insulating film 103b, a part of the tunnel insulating film 103, has a higher oxygen concentration than the charge-storage insulating film 104.

FIGS. 2A to 2E are diagrams of the concentration of oxygen in the tunnel insulating film 103 and the charge-storage insulating film 104. As shown in FIGS. 2A to 2E, regardless of the form of the graph of the oxygen concentration, the effects of the present embodiment are exerted provided that the oxygen in the intermediate insulating film 103b has a higher average concentration than that in the charge-storage insulating film 104.

According to the above-described embodiment, the intermediate insulating film 103b, a part of the tunnel insulating film 103, contains a larger amount of oxygen than the charge-storage insulating film 104. A large amount of oxygen thus contained in the silicon nitride film in the tunnel insulating film 103 reduces the charge trap state in the silicon nitride film. The charge-storage insulating film 104 contains almost no oxygen and thus provides a sufficient charge trap state. The charge-storage insulating film 104 can thus reliably store charges. Thus, the present embodiment can provide a nonvolatile semiconductor memory device with an excellent write/erase property, an excellent charge retention property, and high reliability.

FIGS. 3 to 8 are sectional views schematically showing the basic structure of the semiconductor device according to the present invention; the sectional views are taken along the bit line direction.

Figure 3:
FIG. 3 is a sectional view schematically showing a part of a process of manufacturing a semiconductor device according to the first embodiment of the present invention.

First, as shown in FIG. 3, the semiconductor substrate 101 is cleaned.

Figure 4:
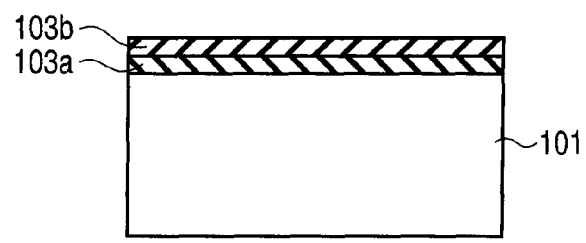
FIG. 4 is a sectional view schematically showing a part of the process of manufacturing the semiconductor device according to the first embodiment of the present invention.

Then, as shown in FIG. 4, the surface of the semiconductor substrate 101 is oxidized by a thermal oxidation method at 800 to 1,000° C. to form a silicon oxide film having a thickness of about 1.0 to 2.5 nm and serving as a lower insulating film 103a. Forming the lower insulating film 103a at the high temperature enables the reaction between the semiconductor substrate 101 and nitrogen to be inhibited when a silicon nitride film is formed during a subsequent step. Furthermore, after the formation of the lower insulating film 103a, heat treatment is carried out in an NO atmosphere at 800 to 900° C. to introduce nitrogen into the interface between the semiconductor substrate 101 and the lower insulating film 103a. This allows the stress resistance of the tunnel insulating film 103 to be improved. The above-described heat treatment enables the reaction between the semiconductor substrate 101 and both nitriding agent and oxidizer to be inhibited. This is advantageous for a reduction in the thickness of the tunnel insulating film 103.

To form the lower insulating film 103*a* on the semiconductor substrate 101 by deposition, a silicon oxide film is deposited at 700 to 800° C. by the low-pressure chemical vapor deposition (LPCVD) method. In this case, a dense silicon oxide film is formed, thus inhibiting the semiconductor substrate 101 and the nitriding agent. As a precursor, for example, $SiH_2Cl_2$ (dichlorosilane [DCS]) and $N_2O$ or $Si_2H_6$ (disilane [DS]) and $N_2O$ are used. Using $N_2O$ as a precursor allows nitrogen to be introduced into the interface between the semiconductor substrate 101 and the lower insulating film 103*a*. This enables the stress resistance to be improved and allows the reaction between the semiconductor substrate 101 and both nitriding agent and oxidizer to be inhibited. If the lower insulating film 103*a* is formed at low temperature, the reaction of the semiconductor substrate 101 can be inhibited by densifying the silicon oxide film by heat treatment at 900 to 1,000° C.

Thereafter, a silicon nitride film having a thickness of 1.0 to 3.0 nm and serving as the intermediate insulating film 103*b* is formed on the lower insulating film 103*a* at a temperature of at most 450° C. Forming the silicon nitride film at the low temperature of at most 450° C. allows an appropriately flat silicon nitride film to be deposited on the lower insulating film 103*a*.

The atomic layer deposition (ALD) method is preferably used as a method of forming a silicon nitride film at the low temperature of at most 450° C. For example, DCS and ammonia may be used as a precursor. Nitrogen radicals may also be used as a nitriding agent.

Moreover, forming the silicon nitride film at a temperature of at most 450° C. allows formation of a silicon nitride film into which oxygen can be easily introduced. Thus, a high concentration of oxygen can be introduced into the silicon nitride film.

Figure 5:
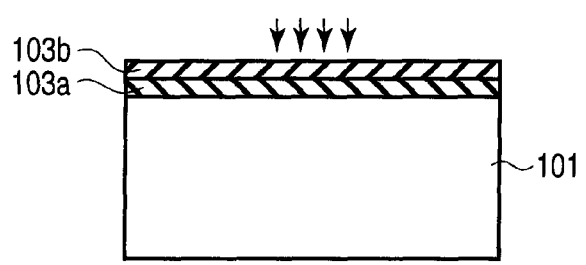
FIG. 5 is a sectional view schematically showing a part of the process of manufacturing the semiconductor device according to the first embodiment of the present invention.

Then, as shown in FIG. 5, the silicon nitride film formed at the low temperature is exposed to an oxidizing atmosphere at 400 to 900° C. to introduce oxygen into the silicon nitride film. The introduction of oxygen into the silicon nitride film enables the charge trap state in the silicon nitride film to be significantly reduced. In particular, heat treatment in an atmosphere at 400 to 700° C. containing steam enables the charge trap state to be more significantly reduced. In this manner, the intermediate insulating film 103*b* is formed.

Figure 6:
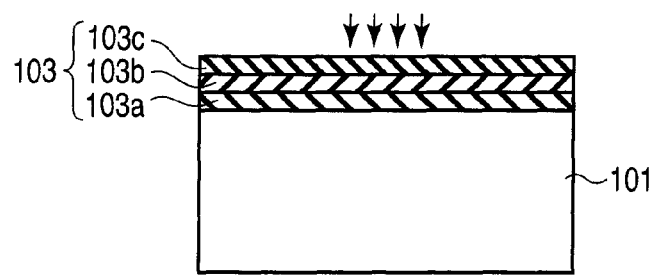
FIG. 6 is a sectional view schematically showing a part of the process of manufacturing the semiconductor device according to the first embodiment of the present invention.

Then, as shown in FIG. 6, after the formation of the intermediate insulating film 103*b*, a silicon oxide film having a thickness of about 1.0 to 3.0 nm and serving as the upper insulating film 103*c* is deposited at 450 to 600° C. using the ALD method. The ALD method at the low temperature allows a flat, thin silicon oxide film to be formed on the intermediate insulating film 103*b* with elements prevented from being relocated. Furthermore, a silicon oxide film of high quality with a possible leakage current reduced is obtained. For example, DCS and $O_3$ are preferably used as a precursor. By introducing oxygen after the formation of the upper insulating film 103*c*, the charge trap state in the intermediate insulating film 103*b* can be reduced, and the charge trap state at the interface between the intermediate insulating film 103*b* and the upper insulating film 103*c* can also be reduced. If oxygen is introduced after the formation of the upper insulating film 103*c*, the oxygen introduction is preferably carried out in a temporarily diluted oxidizing atmosphere at 600 to 900° C. at which the elements are prevented from being relocated.

Then, as shown in FIG. 7, a silicon nitride film serving as the charge-storage insulating film 104 is deposited on the upper insulating film 103*c* using the LPCVD method at 600° C. or higher. Forming the charge-storage insulating film 104 at high temperature allows oxidation resistance to be improved.

Excellent oxidation resistance is offered by the charge-storage insulating film 104 is formed using the ALD method at a temperature of at least 550° C. If the charge-storage insulating film 104 is formed at a temperature of at most 550° C., heat treatment in an inert gas atmosphere at 700 to 1,000° C. densities the silicon nitride film to improve the oxidation resistance. This exerts effects similar to those exerted by the formation of a silicon nitride film by the LPCVD method.

An alumina film having a thickness of about 10 to 20 nm and serving as the block insulating film 105 is formed on the charge-storage insulating film 104 by the ALD or metal organic chemical vapor deposition (MOCVD) method. When the ALD or MOCVD method is used, for example, trimethyl aluminum (TMA) and $H_2O$ or $O_3$ are used as a precursor. Moreover, polysilicon having a thickness of about 150 to 200 nm and serving as a control gate electrode film 106 is deposited by the LPCVD method. For the control gate electrode film 106, a metal material with a work function may be formed by the sputtering or ALD method.

Forming the charge-storage insulating film 104 at high temperature inhibits reducing of the charge trap state in the charge-storage insulating film 104 caused by the oxidizer during the formation of the block insulating layer 105, the oxidizer during the formation of an interlayer insulating film, or the like.

Then, as shown in FIG. 8, the above-described films are processed to form the control gate electrode 106.

Thereafter, impurity elements such as arsenic are ion-injected into a surface region on the semiconductor substrate 101, which is then heat treated. Thus, a source/drain region 102 is formed as shown in FIG. 1.

Thereafter, well-known steps, that is, a step of forming an interlayer insulating film (not shown in the drawings) and a step of forming wiring (not shown in the drawings) and the like, are carried out to obtain a nonvolatile semiconductor memory device.

According to the above-described embodiment, the intermediate insulating film 103*b* is formed by introducing oxygen into the silicon nitride film provided on the lower insulating film 103*a*. Thus, the introduction of oxygen into the silicon nitride film enables the charge trap state in the silicon nitride film to be significantly reduced. Consequently, a tunnel insulating film of high quality is obtained.

In the above-described embodiment, the silicon nitride film is formed on the lower insulating film 103*a* at the low temperature. Thus, a high concentration of oxygen can be easily introduced into the silicon nitride film. Moreover, an appropriately flat silicon nitride film can be formed on the lower insulating film 103*a*. As a result, a possible low-field leakage current through a local leakage path can be inhibited, thus improving the charge retention property. This also inhibits generation of the charge trap state caused by penetration of the nitriding agent to the interface between the semiconductor substrate 101 and the lower insulating film 103*a*. Thus, a possible trap assist tunnel current can be inhibited, enabling a reduction in the field leakage current from the tunnel insulating film 103. As a result, the read disturb property of the memory cell transistor can be drastically improved.

Furthermore, according to the above-described embodiment, the charge-storage insulating film 104 is formed by depositing a silicon nitride film on the upper insulating film 103c at the high temperature. The formation at the high temperature allows a silicon nitride film with high oxidation resistance to be formed. Thus, a sufficient trap state can be ensured.

In the above-described embodiment, the intermediate insulating film 103b is formed by depositing a silicon nitride film on the lower insulating film 103a and then oxidizing the silicon oxide film. However, the intermediate insulating film 103b may be a silicon oxynitride film directly formed by the ALD method at low temperature. In this case, no oxidizer needs to be subsequently supplied, enabling a reduction in the number of steps required. To form the silicon oxynitride film by the ALD method, for example, DCS, a radicalized nitriding agent, and a radicalized oxidizer may be sequentially supplied. The ratio of nitrogen and oxygen in the silicon oxynitride film can be controlled by controlling the ratio of the amount of oxidizer supplied to the amount of nitriding agent supplied.

(Modification)

FIGS. 9 to 15 are sectional views schematically showing a basic method for manufacturing a semiconductor device according to a modification of the first embodiment; the sectional views are taken along the bit line direction. The basic structure and the basic manufacturing method are similar to those in the above-described embodiment. Thus, the matters described above in the embodiment and matters easily conceivable from the embodiment will not be described below.

Figure 9:
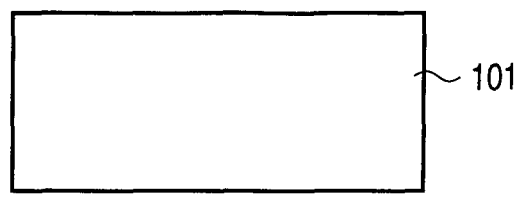
FIG. 9 is a sectional view schematically showing a part of a process of manufacturing a semiconductor device according to a modification of the first embodiment of the present invention.

First, as shown in FIG. 9, the semiconductor substrate 101 is cleaned.

Figure 10:
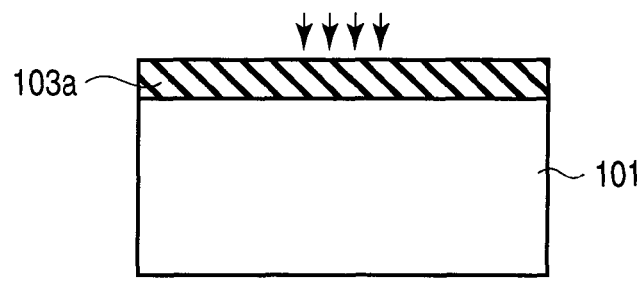
FIG. 10 is a sectional view schematically showing a part of the process of manufacturing the semiconductor device according to the modification of the first embodiment of the present invention.

Then, as shown in FIG. 10, the surface of the semiconductor substrate 101 is oxidized by the thermal oxidation method at 800 to 1,000° C. to form a silicon oxide film having a thickness of about 2.0 to 4.0 nm and serving as a lower insulating film 103a. Forming the lower insulating film 103a at the high temperature enables the reaction between the semiconductor substrate 101 and nitrogen to be inhibited when a silicon nitride film is formed during a subsequent step. Furthermore, after the formation of the lower insulating film 103a, heat treatment is carried out in an NO atmosphere at 800 to 900° C. to introduce nitrogen into the interface between the semiconductor substrate 101 and the lower insulating film 103a. This allows the stress resistance of the tunnel insulating film 103 to be improved.

Figure 11:
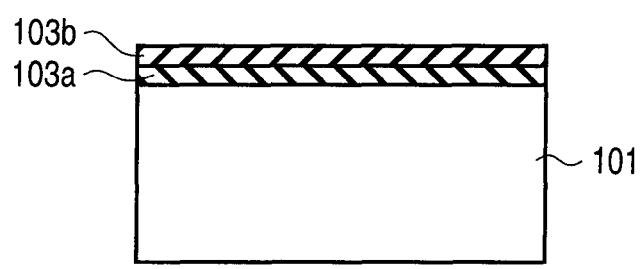
FIG. 11 is a sectional view schematically showing a part of the process of manufacturing the semiconductor device according to the modification of the first embodiment of the present invention.

Then, as shown in FIG. 11, nitrogen is introduced into an upper portion of the silicon oxide film 103a by a plasma or radical nitriding method to form a silicon oxynitride film having a thickness of about 1.0 to 3.0 nm and serving as an intermediate insulating film 103b. As a result, the upper portion of the silicon oxide film 103a is reformed into a silicon oxynitride film containing a large amount of oxygen and in which a reduced number of charges are trapped. In this case, the thickness of the silicon oxide film 103a is reduced to about 1.0 to 2.0 nm. In the plasma or radical nitriding method, the surface of the silicon oxide film 103a may be exposed, at the room temperature to 500° C., to an atmosphere containing ions or radicals serving as a nitriding agent. Furthermore, to reduce damage that may occur while the surface of the silicon oxide film 103a is being reformed, inductively coupled plasma (ICP) or microwave excitation plasma is preferably used. After the reformation, heat treatment is carried out at 900 to 1,050° C. This preferably enables recovery from damage that may occur during the introduction of nitrogen, increasing the lifetime of the tunnel insulating film 103. The atmosphere for the heat treatment preferably contains a small amount of oxygen to the degree that the thickness of the films is prevented from being increased by the oxidation of the semiconductor substrate 101. This is because the small amount of oxygen serves to enhance the reforming effect.

Figure 12:
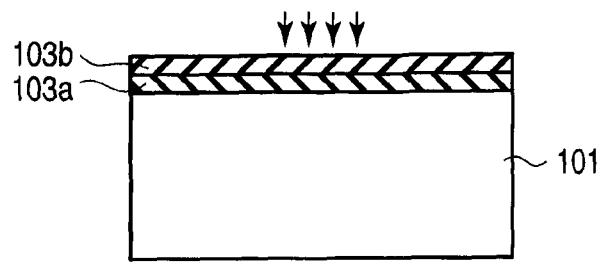
FIG. 12 is a sectional view schematically showing a part of the process of manufacturing the semiconductor device according to the modification of the first embodiment of the present invention.

As shown in FIG. 12, the intermediate insulating film 103b may be heat treated in an atmosphere at 400 to 700° C. containing steam to introduce oxygen into the intermediate insulating film 103b.

Figure 13:
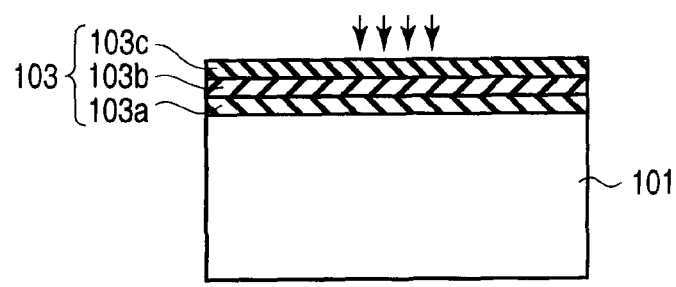
FIG. 13 is a sectional view schematically showing a part of the process of manufacturing the semiconductor device according to the modification of the first embodiment of the present invention.

Then, as shown in FIG. 13, after the intermediate insulating film 103b is reformed and heat treated, a silicon oxide film having a thickness of about 1.0 to 3.0 nm and serving as an upper insulating film 103c is deposited using the ALD method at 450 to 600° C. After the formation of the upper insulating film 103c, oxygen may be introduced into the intermediate insulating film 103b via the upper insulating film 103c in a diluted oxidizing atmosphere at 600 to 900° C. at which the elements are prevented from being relocated.

Figure 2D:
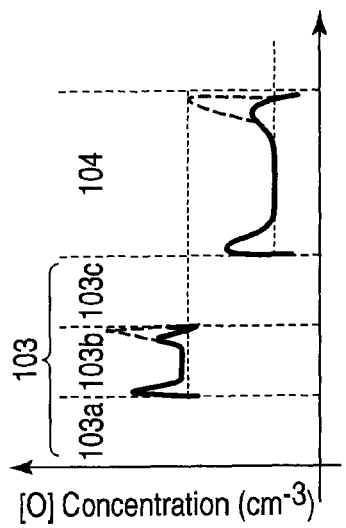
FIGS. 2A to 2E are diagrams showing the distribution of the concentration of oxygen in a tunnel insulating film and a charge-storage insulating film in a semiconductor device according to a first embodiment of the present invention.
Figure 2E:
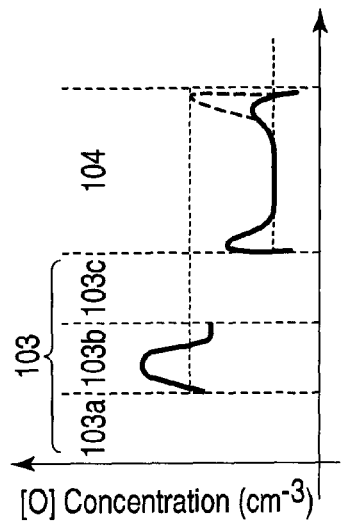
Figure 2A:
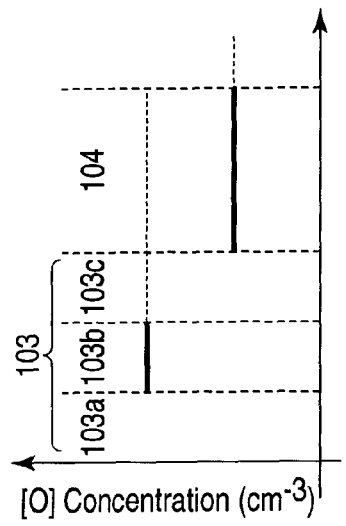
Figure 2B:
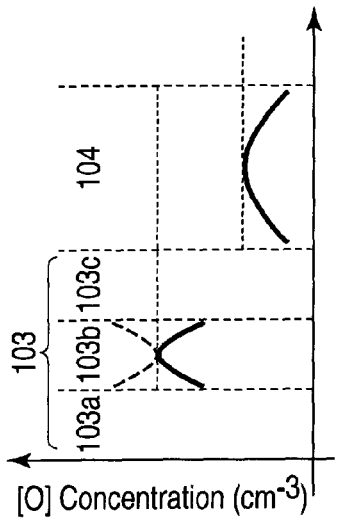
Figure 2C:
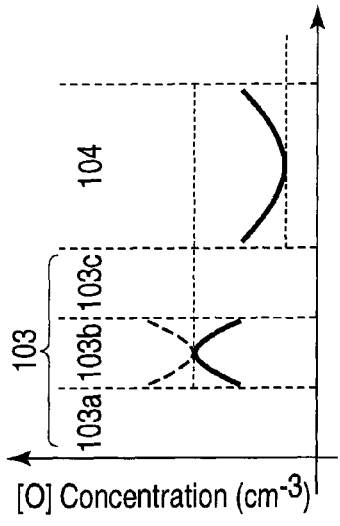
Figure 14:
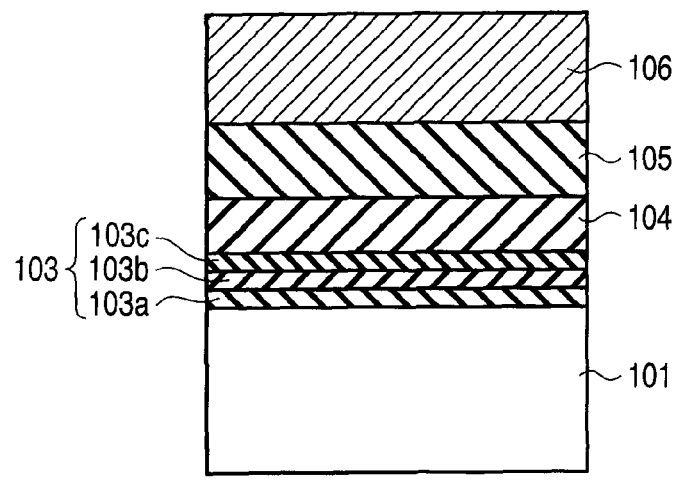
FIG. 14 is a sectional view schematically showing a part of the process of manufacturing the semiconductor device according to the modification of the first embodiment of the present invention.
Figure 17A:
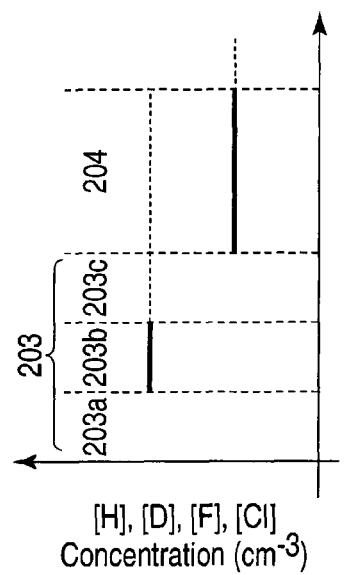
FIGS. 17A to 17D are diagrams showing the distribution of the concentration of a predetermined element in a tunnel insulating film and a charge-storage insulating film in the semiconductor device according to the first embodiment of the present invention.
Figure 17B:
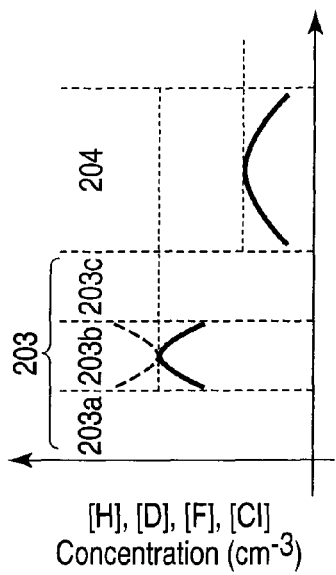
Figure 17C:
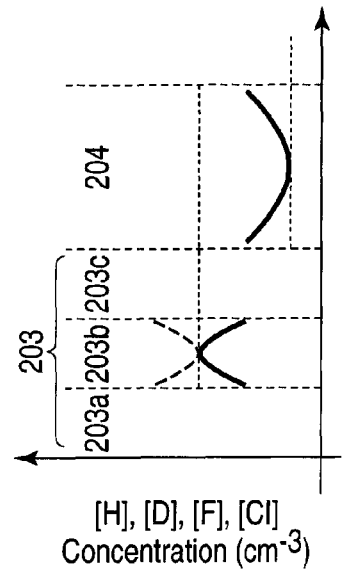
Figure 17D:
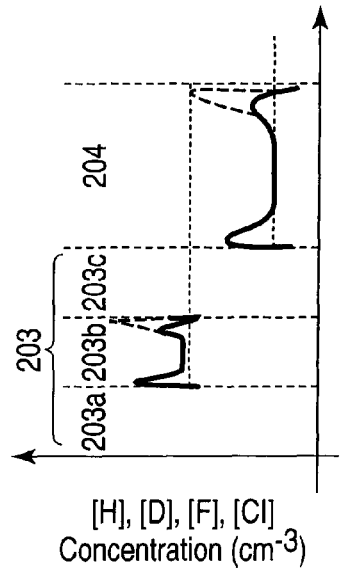

Then, as shown in FIG. 14, as is the case with the first embodiment, a silicon nitride film serving as a charge-storage insulating film 104 is deposited on the upper insulating film 103c using the LPCVD method at 600° C. or higher. In the present embodiment, such an oxygen concentration distribution as shown in FIG. 2E is obtained.

Then, as is the case with the first embodiment, an alumina film having a thickness of about 10 to 20 nm and serving as a block insulating film 105 is formed on the charge-storage insulating film 104 using the ALD or MOCVD method. Moreover, polysilicon having a thickness of about 150 to 200 nm and serving as a control gate electrode film 106 is deposited by the LPCVD method.

Then, as shown in FIG. 15, the control gate electrode 106 is formed by a lithography process as is the case with the first embodiment.

Thereafter, impurity elements such as arsenic are ion-injected into a surface region on the semiconductor substrate 101, which is then heat treated. Thus, a source/drain region 102 is formed as shown in FIG. 1.

Thereafter, well-known steps, that is, a step of forming an interlayer insulating film (not shown in the drawings) and a step of forming wiring (not shown in the drawings) and the like, are carried out to obtain a nonvolatile semiconductor memory device.

The above-described modification exerts effects similar to those of the first embodiment. Furthermore, according to the above-described modification, the intermediate insulating film 103b is formed by nitriding the upper portion of the lower insulating film 103a by plasma or radical nitriding. Thus, the concentration of nitrogen in the intermediate insulating film 103b can be varied in stages from the surface to the interior of the film. This prevents a definite interface from being formed between the lower insulating film 103a and the intermediate insulating film 103b. Consequently, the charge trap state is reduced which is formed at the interface between the lower insulating film 103a and the intermediate insulating film 103b. Therefore, the charge retention property can be improved.

Second Embodiment

FIG. 16 is a sectional view schematically showing the basic structure of a semiconductor device according to the present invention; the sectional view is taken along the bit line direction.

First, the configuration of the present embodiment will be described with reference to FIG. 16. The basic structure and the basic manufacturing method are similar to those in the first embodiment. Thus, the matters described in the first embodiment and matters easily conceivable from the first embodiment will not be described below.

As shown in FIG. 16, an element region with a source/drain region 202 is formed in a semiconductor substrate 201. A tunnel insulating film 203 is formed on the element region. A charge-storage insulating film 204 is formed on the tunnel insulating film 203. A block insulating film 205 is formed on the charge-storage insulating film 204. A control gate electrode 206 is formed on the block insulating film 205.

The tunnel insulating film 203 has a lower insulating film 203a containing silicon and oxygen, an intermediate insulating film 203b formed on the lower insulating film 203a and containing silicon, nitrogen, and a predetermined element selected from hydrogen, deuterium, and halogen, and an upper insulating film 203c formed on the intermediate insulating film 203b and containing silicon and oxygen. Specifically, the tunnel insulating film 203 has the lower insulating film 203a formed of a silicon oxide film and having a thickness of about 1 to 2 nm, the intermediate insulating film 203b having a thickness of about 1 to 3 nm and formed of a silicon nitride film containing at least element selected from deuterium, hydrogen, fluorine, and chlorine, and the upper insulating film 203c formed of a silicon oxide film and having a thickness of about 1 to 4 nm.

The charge-storage insulating film 204 is formed of a silicon nitride film of thickness about 2 to 5 nm. The block insulating film 205 is formed of a silicon oxide film or a high-dielectric-constant insulating film of thickness about 10 to 25 nm. The high-dielectric-constant insulating film is, for example, alumina, which exhibits a large band gap. The control gate electrode 206 is formed of polysilicon or a metal material. The metal material is desirably metal with a high work function.

In the present embodiment, the predetermined element (deuterium, hydrogen, fluorine, or chlorine) in the intermediate insulating film 203b, a part of the tunnel insulating film 203, has a higher concentration than that in the charge-storage insulating film 204.

FIGS. 17A to 17D are diagrams showing the distribution of the concentration of the predetermined element (deuterium, hydrogen, fluorine, or chlorine) in the tunnel insulating film 203 and the charge-storage insulating film 204. As shown in FIGS. 17A to 17D, regardless of the form of the distribution of the concentration of the predetermined element, the effects of the present embodiment are exerted provided that the predetermined element in the intermediate insulating film 203b has a higher average concentration than that in the charge-storage insulating film 204.

According to the above-described embodiment, the intermediate insulating film 203b, a part of the tunnel insulating film 203, contains a larger amount of the predetermined element (deuterium, hydrogen, fluorine, or chlorine) than the charge-storage insulating film 204. Thus, when a large amount of the predetermined element is contained in the silicon nitride film in the tunnel insulating film 203, dangling bonds present in the silicon nitride film can be terminated. Thus, the charge trap state is reduced. Moreover, dangling bonds can be terminated which are present at the interface between the lower insulating film 203a and the intermediate insulating film 203b and at the interface between the intermediate insulating film 203b and the upper insulating film 203c. The charge-storage insulating layer 204 contains almost none of the predetermined element and is thus in a sufficient charge trap state. Thus, charges can be reliably stored in the charge-storage insulating film 204. As a result, the present embodiment can provide a nonvolatile semiconductor memory device with an excellent write/erase property, an excellent charge retention property, and high reliability.

If the intermediate insulating film 203b contains deuterium or hydrogen, the elements diffuse to the interface between the semiconductor substrate 201 and the lower insulating film 203a to terminate the dangling bonds. This prevents the films from being degraded under write or erase stress. This improvement effect is enhanced particularly when the intermediate insulating film 203b contains deuterium.

FIGS. 18 to 23 are sectional views schematically showing a basic method for manufacturing the semiconductor device according to the present embodiment; the sectional views are taken along the bit line direction.

Figure 18:
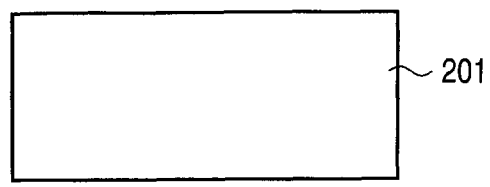
FIG. 18 is a sectional view schematically showing a part of a process of manufacturing a semiconductor device according to the second embodiment of the present invention.

First, as shown in FIG. 18, the semiconductor substrate 201 is cleaned.

Figure 19:
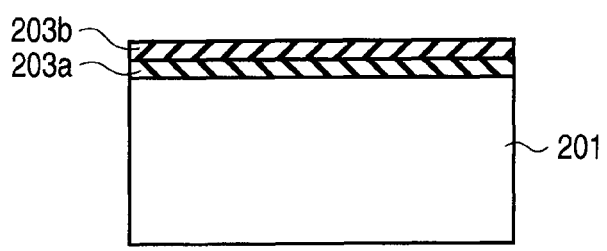
FIG. 19 is a sectional view schematically showing a part of the process of manufacturing the semiconductor device according to the second embodiment of the present invention.
Figure 20:
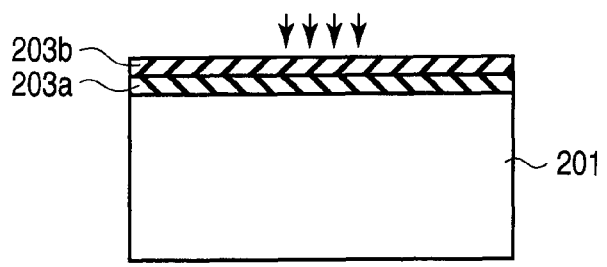
FIG. 20 is a sectional view schematically showing a part of the process of manufacturing the semiconductor device according to the second embodiment of the present invention.

Then, as shown in FIG. 19, as is the case with the first embodiment, the surface of the semiconductor substrate 201 is oxidized by the thermal oxidation method at 800 to 1,000° C. to form a silicon oxide film having a thickness of about 1.0 to 2.5 nm and serving as a lower insulating film 203a. Furthermore, after the formation of the lower insulating film 203a, heat treatment is carried out in an NO atmosphere at 800 to 900° C. to introduce nitrogen into the interface between the semiconductor substrate 201 and the lower insulating film 203a. This improves the stress resistance of the tunnel insulating film 203.

To form the lower insulating film 203a on the semiconductor substrate 201 by deposition, a silicon oxide film is deposited at 700 to 800° C. by the LPCVD method.

Thereafter, a silicon nitride film having a thickness of about 1.0 to 3.0 nm and serving as the intermediate insulating film 203b is formed on the lower insulating film 203a at a temperature of at most 450° C. Forming the silicon nitride film at the low temperature of at most 450° C. allows an appropriately flat silicon nitride film to be deposited on the lower insulating film 203a. Furthermore, the formation of the intermediate insulating film 203b at the low temperature makes hydrogen or chlorine (residues of an Si precursor) likely to remain in the silicon nitride film.

The ALD method is preferably used as a method of forming a silicon nitride film at the low temperature of at most 450° C. For example, DCS and ammonia may be used as a precursor.

Then, after the formation of the intermediate insulating film 203b, the above-described predetermined element is introduced. Specifically, the introduction is carried out as follows.

To allow fluorine to be introduced, heat treatment at 400 to 700° C. is carried out in an atmosphere containing fluorine. Then, fluorine can be introduced into the intermediate insulating film 203b and into the interface between the lower insulating film 203a and the intermediate insulating film 203b.

To allow deuterium or hydrogen to be introduced, heat treatment at 400 to 600° C. is carried out in an atmosphere containing deuterium or hydrogen. Then, deuterium or hydrogen can be introduced into the intermediate insulating film 203b, into the interface between the semiconductor substrate 201 and the lower insulating film 203a, and into the interface between the lower insulating film 203a and the intermediate insulating film 203b.

Figure 21:
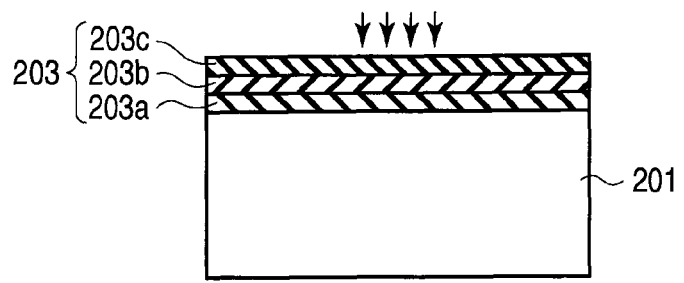
FIG. 21 is a sectional view schematically showing a part of the process of manufacturing the semiconductor device according to the second embodiment of the present invention.

Then, as shown in FIG. 21, after the intermediate insulating film 203b is reformed and heat treated, a silicon oxide film having a thickness of about 1.0 to 3.0 nm and serving as an upper insulating film 203c is deposited using the ALD method at 450 to 600° C. The upper insulating film 203c is formed by depositing a silicon oxide film on the intermediate insulating film 203b at a low temperature. After the formation of the upper insulating film 203c, oxygen may be introduced to reduce the charge trap state at the interface between the intermediate insulating film 203b and the upper insulating film 203c.

Then, as shown in FIG. 22, as is the case with the first embodiment, a silicon nitride film serving as a charge-storage insulating film 204 is deposited on the upper insulating film 203c using the LPCVD method at 600° C. or higher. The formation of the charge-storage insulating layer 204 at the high temperature enables a reduction in the concentration of hydrogen and chlorine in the charge-storage insulating layer 204.

Impurities (hydrogen and chlorine) in the charge-storage insulating film 204 can also be reduced by forming the charge-storage insulating film 204 using the ALD method at a temperature of at least 550° C. When the charge-storage insulating layer 204 is formed at a temperature of at most 550° C., heat treatment is carried out in an inert gas atmosphere at 700 to 1,000° C. to anneal out the impurities. The impurities can thus be reduced. This produces effects similar to those exerted when a silicon nitride film is formed by the LPCVD method.

Then, as is the case with the first embodiment, an alumina film having a thickness of about 10 to 20 nm and serving as a block insulating film 205 is formed on the charge-storage insulating film 204 using the ALD or MOCVD method. Moreover, polysilicon having a thickness of about 150 to 200 nm and serving as a control gate electrode film 206 is deposited by the LPCVD method.

Then, as shown in FIG. 23, the control gate electrode 206 is formed by the lithography process as is the case with the first embodiment.

Thereafter, impurity elements such as arsenic are ion-injected into a surface region on the semiconductor substrate 201, which is then heat treated. Thus, a source/drain region 202 is formed as shown in FIG. 16.

Thereafter, well-known steps, that is, a step of forming an interlayer insulating film (not shown in the drawings) and a step of forming wiring (not shown in the drawings) and the like, are carried out to obtain a nonvolatile semiconductor memory device.

According to the present embodiment, the intermediate insulating film 203b is formed by introducing the predetermined element (deuterium, hydrogen, fluorine, or chlorine) into the silicon nitride film provided on the lower insulating film 203a. Introducing the predetermined element into the silicon nitride film in this manner allows the dangling bonds in the silicon nitride film to be terminated. The charge trap state can thus be significantly reduced.

According to the above-described embodiment, the silicon nitride film is formed on the lower insulating film 203a at the low temperature as is the case with the first embodiment. Thus, a high concentration of the predetermined element can be easily introduced into the silicon nitride film. Furthermore, the silicon nitride film can be appropriately flatly formed on the lower insulating film 203a. Consequently, a possible low-field leakage current through a local leakage path can be inhibited, thus improving the charge retention property. This also inhibits generation of the charge trap state caused by penetration of the nitriding agent to the interface between the semiconductor substrate 201 and the lower insulating film 203a. Thus, a possible trap assist tunnel current can be inhibited, enabling a reduction in the field leakage current from the tunnel insulating film 203. As a result, the read disturb property can be drastically improved.

Furthermore, according to the above-described embodiment, the charge-storage insulating film 204 is formed by depositing a silicon nitride film on the upper insulating film 203c at the high temperature as is the case with the first embodiment. The formation at the high temperature allows formation of a silicon nitride film into which the predetermined element is unlikely to be introduced. Thus, a sufficient trap state can be ensured.

(Modification)

FIGS. 24 to 30 are sectional views schematically showing a basic method for manufacturing a semiconductor device according to a modification of the second embodiment; the sectional views are taken along the bit line direction. The basic structure and the basic manufacturing method are similar to those in the above-described first and second embodiments. Thus, the matters described above in the above-described first and second embodiments and matters easily conceivable from the above-described first and second embodiments will not be described below.

First, as shown in FIG. 24, the semiconductor substrate 201 is cleaned.

Then, as shown in FIG. 25, the surface of the semiconductor substrate 201 is oxidized by the thermal oxidation method at 800 to 1,000° C. to form a silicon oxide film having a thickness of about 2.0 to 4.0 nm and serving as a lower insulating film 203a. Forming the lower insulating film 203a at the high temperature enables the reaction between the semiconductor substrate 201 and nitrogen to be inhibited when a silicon nitride film is formed during a subsequent step. Furthermore, after the formation of the lower insulating film 203a, heat treatment is carried out in an NO atmosphere at 800 to 900° C. to introduce nitrogen into the interface between the semiconductor substrate 201 and the lower insulating film 203a. This allows the stress resistance of the tunnel insulating film 203 to be improved.

Then, as shown in FIG. 26, nitrogen is introduced into an upper portion of the silicon oxide film 203a by the plasma or radical nitriding method to form a silicon oxynitride film having a thickness of about 1.0 to 3.0 nm and serving as an intermediate insulating film 203b. As a result, the upper portion of the silicon oxide film 203a is reformed into a silicon oxynitride film containing a large amount of oxygen and in which a reduced number of charges are trapped. In this case, the thickness of the silicon oxide film 203a is reduced to about 1.0 to 2.0 nm. In the plasma or radical nitriding method, the surface of the silicon oxide film 203a may be exposed, at the room temperature to 500° C., to an atmosphere containing ions or radicals serving as a nitriding agent. Furthermore, to reduce damage that may occur during reformation, ICP or microwave excitation plasma is preferably used. After the reformation, heat treatment is carried out at 900 to 1,050° C. This preferably enables recovery from damage that may occur during the introduction of nitrogen.

Then, as shown in FIG. 27, heat treatment may be additionally carried out, at 400 to 700° C., in an atmosphere containing steam, to introduce oxygen into the intermediate insulating film 203b.

Then, an intermediate insulating film 203b is formed, and the above-described predetermined element is introduced into the intermediate insulating film. Specifically, the introduction is performed as follows.

To allow fluorine to be introduced, heat treatment at 400 to 700° C. is carried out in an atmosphere containing fluorine. Then, fluorine can be introduced into the intermediate insulating film 203b and into the interface between the lower insulating film 203a and the intermediate insulating film 203b.

To allow deuterium or hydrogen to be introduced, heat treatment at 400 to 600° C. is carried out in an atmosphere containing deuterium or hydrogen. Then, deuterium or hydrogen can be introduced into the intermediate insulating film 203b, into the interface between the semiconductor substrate 201 and the lower insulating film 203a, and into the interface between the lower insulating film 203a and the intermediate insulating film 203b.

Then, as shown in FIG. 28, after the intermediate insulating film 203b is reformed and heat treated, a silicon oxide film having a thickness of about 1.0 to 3.0 nm and serving as an upper insulating film 203c is deposited using the ALD method at 450 to 600° C. After the formation of the upper insulating film 203c, oxygen may be introduced into the intermediate insulating film 203b via the upper insulating film 203c in a diluted oxidizing atmosphere at 600 to 900° C. at which the elements are prevented from being relocated.

Then, as shown in FIG. 29, as is the case with the first and second embodiments, a silicon nitride film serving as a charge-storage insulating film 204 is deposited on the upper insulating film 203c using the LPCVD method at 600° C. or higher. The formation of the charge-storage insulating layer 204 at the high temperature enables a reduction in the concentration of hydrogen and chlorine in the charge-storage insulating film 204.

Then, as is the case with the first and second embodiments, an alumina film having a thickness of about 10 to 20 nm and serving as a block insulating film 205 is formed on the charge-storage insulating film 204 using the ALD or MOCVD method. Moreover, polysilicon having a thickness of about 150 to 200 nm and serving as a control gate electrode film 206 is deposited by the LPCVD method.

Then, as shown in FIG. 30, the control gate electrode 206 is formed by the lithography process as is the case with the first and second embodiments.

Thereafter, impurity elements such as arsenic are ion-injected into a surface region on the semiconductor substrate 201, which is then heat treated. Thus, a source/drain region 202 is formed as shown in FIG. 16.

Thereafter, well-known steps, that is, a step of forming an interlayer insulating film (not shown in the drawings) and a step of forming wiring (not shown in the drawings) and the like, are carried out to obtain a nonvolatile semiconductor memory device.

The above-described modification exerts effects similar to those of the second embodiment. Furthermore, according to the above-described modification, the intermediate insulating film 203b is formed by nitriding the upper portion of the lower insulating film 203a by plasma or radical nitriding. Thus, the concentration of nitrogen in the intermediate insulating film 203b can be varied in stages from the surface to the interior of the film. This prevents a definite interface from being formed between the lower insulating film 203a and the intermediate insulating film 203b. Consequently, the charge trap state is reduced which is formed at the interface between the lower insulating film 203a and the intermediate insulating film 203b. Therefore, the charge retention property can be improved.

As is the case with the first embodiment, the charge trap state can be further reduced by introducing a large amount of oxygen into the intermediate insulating film 203b and thereafter introducing the predetermined element (deuterium, hydrogen, fluorine, or chlorine) into the intermediate insulating film 203b.

Third Embodiment

FIG. 31 is a sectional view schematically showing the basic structure of a semiconductor device according to the present invention; the sectional view is taken along the bit line direction.

First, the configuration of the present embodiment will be described with reference to FIG. 31. The basic structure and the basic manufacturing method are similar to those in the first embodiment. Thus, the matters described in the first embodiment and matters easily conceivable from the first embodiment will not be described below.

As shown in FIG. 31, an element region with a source/drain region 302 is formed in a semiconductor substrate 301. A tunnel insulating film 303 is formed on the element region. A charge-storage insulating film 304 is formed on the tunnel insulating film 303. A block insulating film 305 is formed on the charge-storage insulating film 304. A control gate electrode 306 is formed on the block insulating film 305.

The tunnel insulating film 303 has a lower insulating film 303a containing silicon and oxygen, an intermediate insulating film 303b formed on the lower insulating film 303a and containing silicon and nitrogen, and an upper insulating film 303c formed on the intermediate insulating film 303b and containing silicon and oxygen. Specifically, the tunnel insulating film 303 has the lower insulating film 303a formed of a silicon oxide film and having a thickness of about 1 to 2 nm, the intermediate insulating film 303b formed of a silicon nitride with a low trap state density and having a thickness of about 1 to 3 nm, and the upper insulating film 303c formed of a silicon oxide film and having a thickness of about 1 to 4 nm.

The charge-storage insulating film 304 is formed of a silicon nitride film of thickness about 2 to 5 nm. The block insulating film 305 is formed of a silicon oxide film or a high-dielectric-constant insulating film of thickness about 10 to 25 nm. The high-dielectric-constant insulating film is, for example, alumina, which exhibits a large band gap. The control gate electrode 306 is formed of polysilicon or a metal material. The metal material is desirably metal with a high work function.

In the present embodiment, Si in the intermediate insulating film 303b, a part of the tunnel insulating film 303, has a lower concentration than that in the charge-storage insulating film 304. That is, the intermediate insulating film 303b has a lower Si composition ratio and a higher N composition ratio than the charge-storage insulating film 304. As a result, the intermediate insulating film 303b has a lower trap state density than the charge-storage insulating film 304.

In the above-described embodiment, the tunnel insulating film 303 has the stacked structure of the silicon oxide film, the silicon nitride film, and the silicon oxide film. This allows holes to be easily introduced into the charge-storage insulating film 304, enabling the erase property to be improved.

According to the above-described embodiment, the intermediate insulating film 303b has a lower Si concentration than the charge-storage insulating film 304. That is, the intermediate insulating film 303b is formed of a silicon nitride film with a low Si composition ratio. This enables a sufficient reduction in the charge trap state density of the intermediate insulating film 303b. The charge-storage insulating film 304 is formed of a silicon nitride film with a high Si composition ratio. Thus, the charge-storage insulating film 304 has a high charge trap state density and can thus reliably store charges.

As described above, in the present embodiment, the silicon nitride film provided in the tunnel insulating film 303 has a low charge trap state density. The silicon nitride film serving as the charge-storage insulating film 304 has a high charge trap state density. As a result, the present embodiment can provide a nonvolatile semiconductor memory device with an excellent write/erase property, an excellent charge retention property, and high reliability.

FIGS. 32 to 36 are sectional views schematically showing a basic method for manufacturing a semiconductor device according to the present embodiment; the views are taken alone the bit line direction.

First, as shown in FIG. 32, the semiconductor substrate 301 is cleaned.

Then, as shown in FIG. 33, as is the case with the first embodiment, the surface of the semiconductor substrate 301 is oxidized by the thermal oxidation method at 800 to 1,000° C. to form a silicon oxide film having a thickness of about 1.0 to 2.5 nm and serving as a lower insulating film 303a. Furthermore, after the formation of the lower insulating film 303a, heat treatment is carried out in an NO atmosphere at 800 to 900° C. to introduce nitrogen into the interface between the semiconductor substrate 301 and the lower insulating film 303a. This improves the stress resistance of the tunnel insulating film 303.

To form the lower insulating film 303a on the semiconductor substrate 301 by deposition, a silicon oxide film is deposited at 700 to 800° C. by the LPCVD method.

Thereafter, a silicon nitride film with a very low charge trap state density is deposited by using the ALD method at a temperature of 300 to 400° C. and alternately supplying DCS and $N_2^*$ ($N_2$ radicals). In place of $N_2^*$, $N^*$ (N radicals) or $NH^*$ (NH radicals) may be used. In the above-described manner, the silicon nitride film 303b with the very low trap density is formed on the lower insulating film 303a. The silicon nitride film 303b thus formed has a higher nitrogen ratio and a lower silicon ratio than common silicon nitride films.

Then, as shown in FIG. 34, after the formation of the intermediate insulating film 303b, a silicon oxide film having a thickness of about 1.0 to 3.0 nm and serving as an upper insulating film 303c is deposited using the ALD method at 450 to 600° C.

Then, as shown in FIG. 35, a silicon nitride film serving as a charge-storage insulating film 304 is deposited on the upper insulating film 303c using the LPCVD method at 600° C. or higher. At this time, supplying a large amount of Si precursor enables formation of a silicon nitride film containing a larger amount of silicon than a common stoichiometric composition Even if the charge-storage insulating film 304 is formed by the ALD method at a temperature of at least 550° C., effects similar to those described above are exerted by supplying a large amount of Si precursor.

Then, as is the case with the first embodiment, an alumina film having a thickness of about 10 to 20 nm and serving as a block insulating film 305 is formed on the charge-storage insulating film 304 using the ALD or MOCVD method. Moreover, polysilicon having a thickness of about 150 to 200 nm and serving as a control gate electrode film 306 is deposited by the LPCVD method.

Then, as shown in FIG. 36, the control gate electrode 306 is formed by the lithography process as is the case with the first embodiment.

Thereafter, impurity elements such as arsenic are ion-injected into a surface region on the semiconductor substrate 301, which is then heat treated. Thus, a source/drain region 302 is formed as shown in FIG. 31.

Thereafter, well-known steps, that is, a step of forming an interlayer insulating film (not shown in the drawings) and a step of forming wiring (not shown in the drawings) and the like, are carried out to obtain a nonvolatile semiconductor memory device.

According to the above-described embodiment, the intermediate insulating film 303b is formed by forming the silicon nitride film with the low Si composition ratio on the lower insulating film 303a. Thus, the charge trap state in the intermediate insulating film 303b can be reduced.

According to the above-described embodiment, the silicon nitride film is formed on the lower insulating film 303a at the low temperature as is the case with the first embodiment. Thus, the silicon nitride film can be appropriately flatly formed on the lower insulating film 303a. As a result, a possible low-field leakage current through a local leakage path can be inhibited, thus improving the charge retention property. This also inhibits generation of the charge trap state caused by penetration of the nitriding agent to the interface between the semiconductor substrate 301 and the lower insulating film 303a. Thus, a possible trap assist tunnel current can be inhibited, enabling a reduction in the field leakage current from the tunnel insulating film 303. As a result, the read disturb property can be drastically improved.

According to the above-described embodiment, the charge-storage insulating film 304 in the sufficient charge trap state can be obtained by forming the silicon nitride film with the high Si composition ratio on the tunnel insulating film 303. Furthermore, the charge-storage insulating film 304 is formed at the high temperature. Consequently, the silicon nitride film formed is excellent in oxidation resistance and the like, thus ensuring a sufficient charge trap state.

Fourth Embodiment

Now, a fourth embodiment will be described with reference to FIGS. 37A to 61B. In the present embodiment, the configuration of and the manufacturing method for the tunnel insulating film described above in the first to third embodiments are applied to a nonvolatile semiconductor memory device with a three-dimensional structure called bit-cost scalable (BiCS).

FIG. 37A is a sectional view schematically showing the basic configuration of a semiconductor device according to the present embodiment. FIG. 37B is a plan view schematically showing the basic configuration of a semiconductor device according to the present embodiment.

As shown in FIGS. 37A and 37B, a columnar semiconductor region (silicon region) 401 serving as an active region is formed on a substrate 400. A tunnel insulating film 402, a charge-storage insulating film 403, and a block insulating film 404 are formed around the periphery of the semiconductor region 401. That is, the tunnel insulating film 402 is formed on the surface of the semiconductor region 401. The charge-storage insulating film 403 is formed on the surface of the tunnel insulating film 402. The block insulating film 404 is formed on the surface of the charge-storage insulating film 403.

The tunnel insulating film 402 has a first insulating film 402a, a second insulating film 402b, and a third insulating film 402c. The first insulating film 402a corresponds to the lower insulating films 103a, 203a, and 303a shown in the first to third embodiments. The second insulating film 402b corresponds to the intermediate insulating films 103b, 203b, and 303b shown in the first to third embodiments. The third insulating film 402c corresponds to the upper insulating films 103c, 203c, and 303c shown in the first to third embodiments. The various configurations and formation methods described in the first to third embodiments are applicable to the tunnel insulating film 402.

A stacked structure of a plurality of control gate electrodes 405 and a plurality of interlayer insulating films 406 is formed around the periphery of the block insulating film 404, that is, on the surface of the block insulating film 404. The numbers of control gate electrodes 405 and interlayer insulating films 406 stacked are appropriately determined.

As is apparent from the above description, the above-described semiconductor device is configured such that a plurality of memory cells are stacked in the vertical direction. This enables an increase in the number of memory cells per unit area.

Now, with reference to FIGS. 37A to 41B, a basic manufacturing method for the semiconductor device according to the present embodiment will be described.

FIGS. 38A to 41A are sectional views schematically showing a part of the basic manufacturing method for the semiconductor device according to the present embodiment. FIGS. 38B to 41B are plan views schematically showing a part of the basic manufacturing method for the semiconductor device according to the present embodiment.

First, as shown in FIGS. 38A and 38B, silicon oxide film and impurities doped silicon film are alternately stacked a desired number of times using the CVD method; the silicon oxide film has a thickness of about 50 nm and serves as an interlayer insulating film 406, and the silicon film has a thickness of about 50 nm and serves as a control gate electrode 405.

Then, as shown in FIGS. 39A and 39B, the interlayer insulating film 406 and the control gate electrode 405 are selectively etched away by an RIE method using a resist mask (not shown in the drawings). Consequently, the semiconductor substrate 400 is exposed. Thus, a cylindrical hole 407 of diameter about 60 nm is formed in the stacked structure of the interlayer insulating films 406 and the control gate electrodes 405. Thereafter, for example, an alumina film is deposited on the inner wall of the hole 407 using the ALD method; the alumina film has a thickness of about 10 nm, contains aluminum and oxygen as main components, and serves as a block insulating film 404. Alternatively, the block insulating film 404 may be, for example, a silicon oxide film containing silicon and oxygen as main components.

Then, as shown in FIGS. 40A and 40B, a silicon nitride film having a thickness of about 5 nm and serving as a charge-storage insulating film 403 is deposited using the ALD method. Subsequently, a tunnel insulating film 402 of a stacked structure made up of a first insulating film 402a, a second insulating film 402b, and a third insulating film 402c is formed by a method described below.

Figures 41A, 41B:
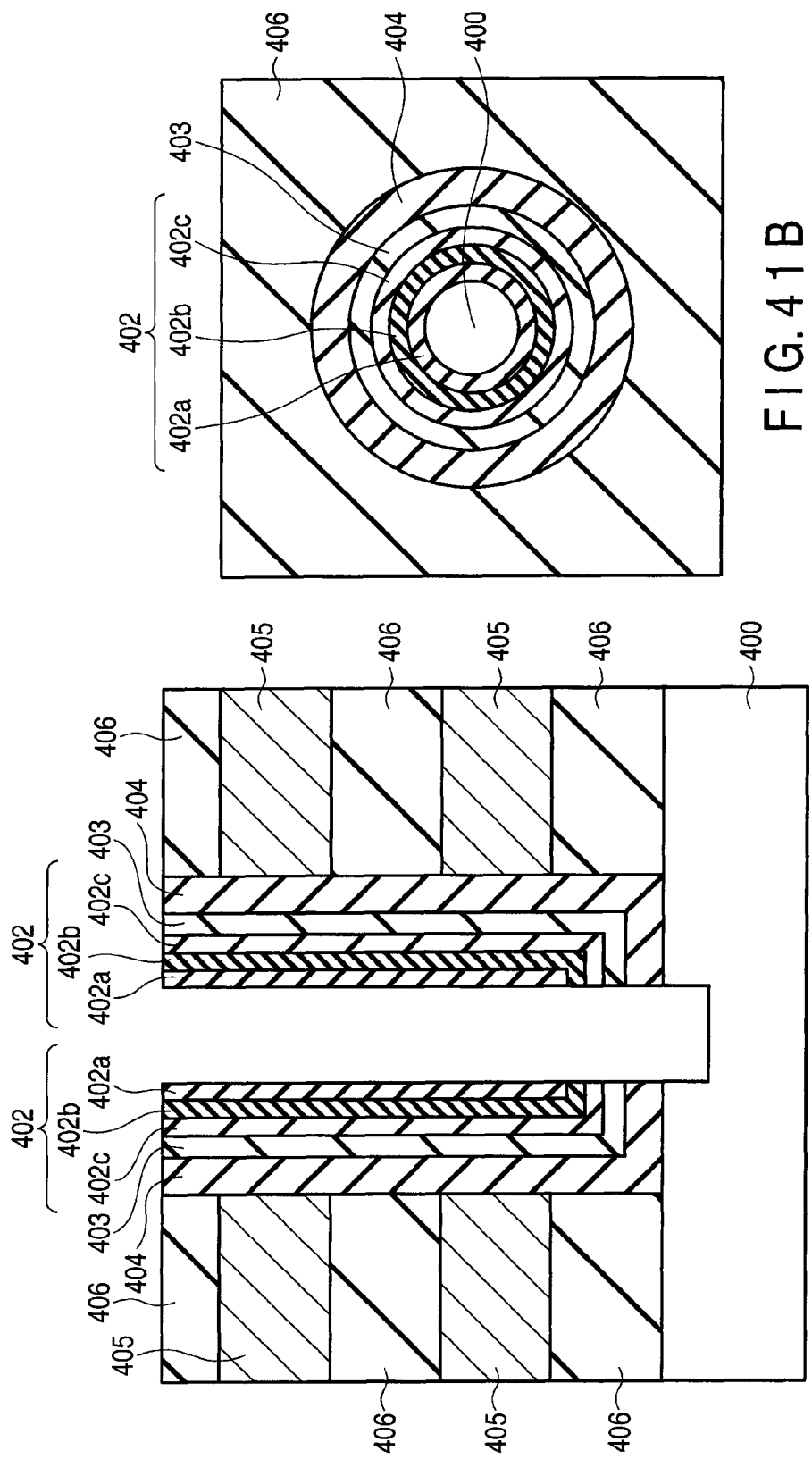
FIGS. 41A and 41B are diagrams schematically showing a part of the process of manufacturing the semiconductor device according to the fourth embodiment of the present invention.
Figure 42D:
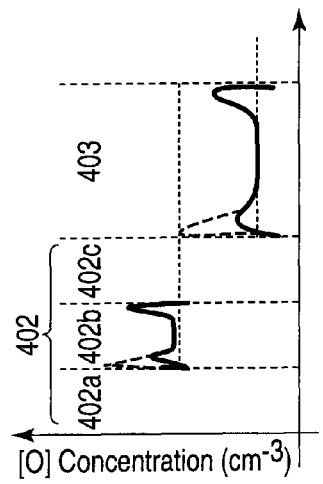
FIGS. 42A to 42E are diagrams showing the distribution of oxygen concentration in a tunnel insulating film 402 and a charge-storage insulating film 403.
Figure 42E:
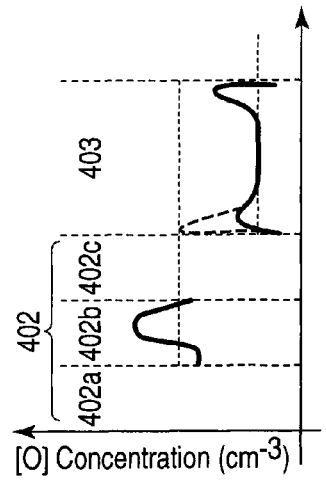
Figure 42A:
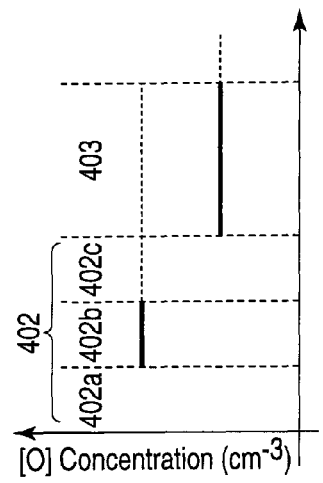
Figure 42B:
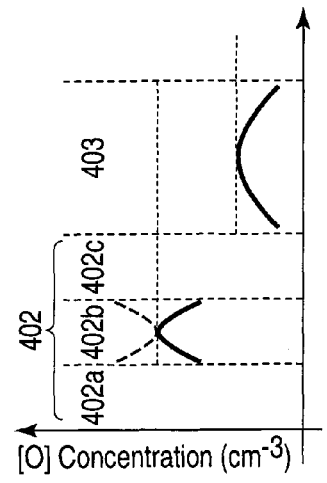
Figure 42C:
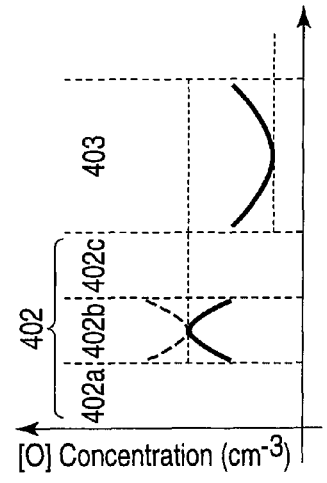

Then, as shown in FIGS. 41A and 41B, the RIE method with a resist mask (not shown in the drawings) is carried out to selectively etch away the surface of the block insulating film 404, charge-storage insulating film 403, tunnel insulating film 402, and semiconductor substrate 400 formed on the bottom surface of the hole 407.

Then, as shown in FIGS. 37A and 37B, a silicon film into which impurities are doped so as to serve as a channel region is deposited by the CVD method. The silicon film is then heat treated in a nitrogen atmosphere at about 600° C. to form a semiconductor region 401. Thereafter, a well-known technique is used to form wiring and the like (not shown in the drawings) to complete a nonvolatile semiconductor memory device.

The correspondence relationship between the present embodiment and the first to third embodiments will be described below.

First, with reference to FIGS. 37A, 37B, 40A, 40B, and 42A to 45B, the application of such a tunnel insulating film as described in the first embodiment to a tunnel insulating film according to the present embodiment will be described.

FIGS. 43A to 45A are sectional views schematically showing a basic method for manufacturing a tunnel insulating film in a semiconductor device according to the present embodiment. FIGS. 43B to 45B are plan views schematically showing the basic method for manufacturing the tunnel insulating film in the semiconductor device according to the present embodiment.

As shown in FIGS. 37A and 37B, as is the case with FIG. 1 for the first embodiment, a tunnel insulating film 402 according to the present embodiment has a first insulating film 402a containing silicon and oxygen, a second insulating film 402b formed on the surface of the first insulating film 402a and containing silicon, nitrogen, and oxygen, and a third insulating film 402c formed on the surface of the second insulating film 402b and containing silicon and oxygen. Specifically, the tunnel insulating film 402 has the first insulating film 402a formed of a silicon oxide film and having a thickness of about 1 to 2 nm, the second insulating film 402b formed of a silicon nitride film containing oxygen (for example, a silicon oxynitride film) and having a thickness of about 1 to 3 nm, and the third insulating film 402c formed of a silicon oxide film and having a thickness of about 1 to 4 nm.

The second insulating film 402b, a part of the tunnel insulating film 402, has a higher oxygen concentration than a charge-storage insulating film 403.

FIGS. 42A to 42E are diagrams of the distribution of the concentration of oxygen in the tunnel insulating film 402 and the charge-storage insulating film 403. As shown in FIGS. 42A to 42E, regardless of the form of the distribution of the oxygen concentration, the effects of the present embodiment are exerted provided that the oxygen in the second insulating film 402b has a higher concentration than that in the charge-storage insulating film 403.

The tunnel insulating film 402 configured as described above enables effects similar to those described in the first embodiment to be exerted.

A component material similar to that described in the first embodiment can be used for the tunnel insulating film 402.

Now, a method for manufacturing the tunnel insulating film 402 corresponding to the first embodiment will be described.

First, as shown in FIGS. 43A and 43B, a silicon oxide film having a thickness of about 1.0 to 3.0 nm and serving as the third insulating film 402c is deposited on the exposed surface of the charge-storage insulating film 403 using the ALD method at 450 to 600° C.

Then, as shown in FIGS. 44A and 44B, a silicon nitride film having a thickness of about 1.0 to 3.0 nm and serving as the second insulating film 402b is formed on the exposed surface of the third insulating film 402c using the ALD method at 450° C. or lower.

Then, as shown in FIGS. 45A and 45B, the silicon nitride film formed at the low temperature is exposed to an oxidizing atmosphere at 400 to 900° C. to introduce oxygen into the exposed surface side region of the silicon nitride film. The second insulating film 402b is thus formed.

Then, as shown in FIGS. 40A and 40B, a silicon nitride film having a thickness of about 1.0 to 2.5 nm and serving as the first insulating film 402a is formed using the ALD method.

Thus, the tunnel insulating film 402 is formed which is similar to the tunnel insulating film 103 according to the first embodiment.

Forming the tunnel insulating film 402 as described above enables effects similar to those described in the first embodiment to be exerted.

Now, with reference to FIGS. 40A, 40B, 46A, 46B, 47A, and 47B, the application of such a variation of the tunnel insulating film as described for the modification of the first embodiment to the tunnel insulating film according to the present embodiment will be described.

Figure 46A:
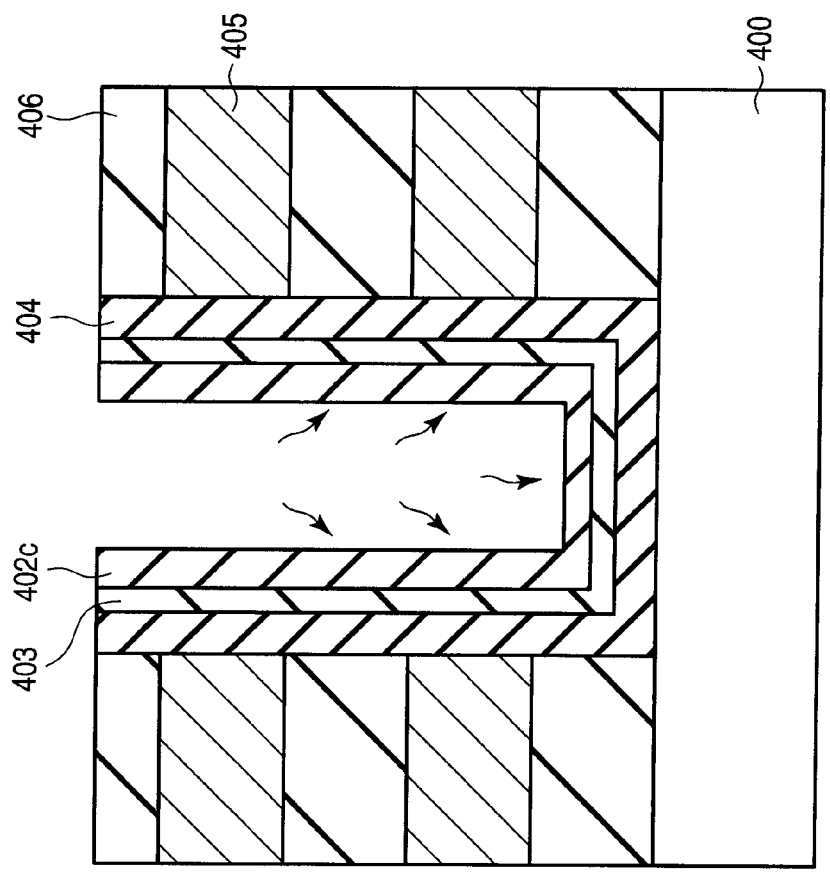
FIGS. 46A and 46B are diagrams schematically showing a part of the process of manufacturing the tunnel insulating film in the semiconductor device according to the fourth embodiment of the present invention.
Figure 46B:
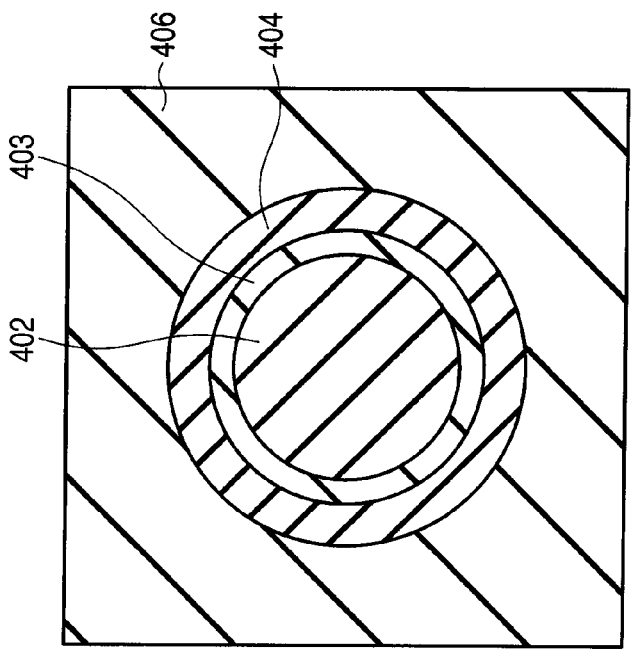
Figure 48C:
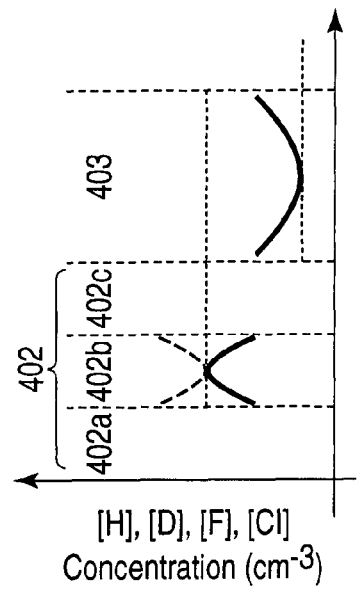
FIGS. 48A to 48D are diagrams showing the distribution of the concentration of a predetermined element (deuterium, hydrogen, fluorine, or chlorine) in a tunnel insulating film 402 and a charge-storage insulating film 403.
Figure 48D:
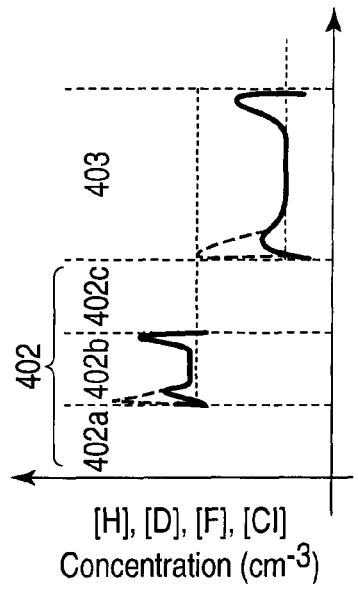
Figure 48A:
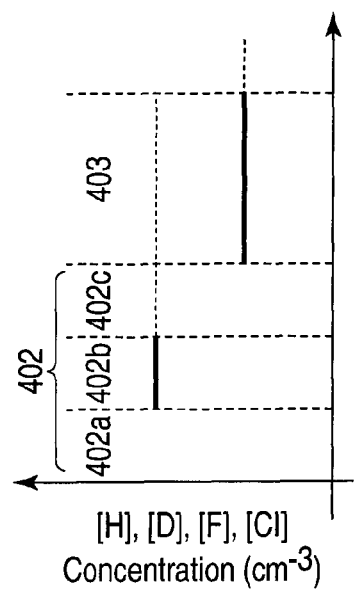
Figure 48B:
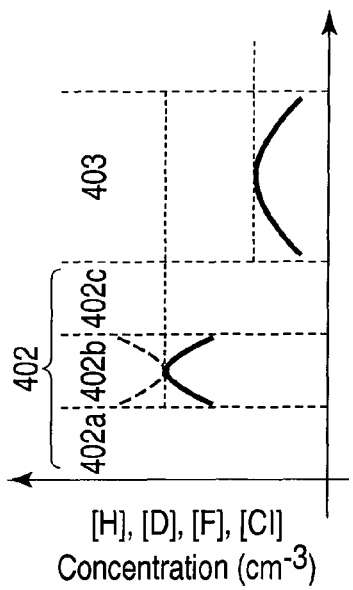

FIGS. 46A and 47A are sectional views schematically showing a basic method for manufacturing a tunnel insulating film in a semiconductor device according to the present embodiment. FIGS. 46B and 47B are plan views schematically showing the basic method for manufacturing the tunnel insulating film in the semiconductor device according to the present embodiment.

First, as shown in FIGS. 46A and 46B, a silicon oxide film having a thickness of about 2.0 to 6.0 nm and serving as the third insulating film 402c is deposited on the exposed surface of the charge-storage insulating film 403 using the ALD method at 450 to 600° C. Nitrogen is subsequently introduced into the exposed surface portion of the silicon oxide film 402c by the plasma or radical nitriding method.

Then, as shown in FIGS. 47A and 47B, a silicon nitride film having a thickness of about 1.0 to 3.0 nm and serving as the second insulating film 402b is formed. As a result, the exposed surface portion of the silicon oxide film 402c is reformed into a silicon oxynitride film containing a large amount of oxygen and in which a reduced number of charges are trapped.

Then, as shown in FIGS. 40A and 40B, a silicon nitride film having a thickness of about 1.0 to 2.5 nm and serving as the first insulating film 402a is formed using the ALD method.

Thus, the tunnel insulating film 402 is formed which is similar to the tunnel insulating film 103 according to the first embodiment.

Forming the tunnel insulating film 402 as described above enables effects similar to those described for the modification of the first embodiment to be exerted.

Now, with reference to FIGS. 37A, 37B, 40A, 40B, and 48A to 51B, the application of such a tunnel insulating film as described in the second embodiment to the tunnel insulating film according to the present embodiment will be described.

FIGS. 49A to 51A are sectional views schematically showing a basic method for manufacturing a tunnel insulating film in a semiconductor device according to the present embodiment. FIGS. 49B to 51B are plan views schematically showing the basic method for manufacturing the tunnel insulating film in the semiconductor device according to the present embodiment.

As shown in FIGS. 37A and 37B, as is the case with FIG. 16 for the second embodiment, a tunnel insulating film 402 according to the present embodiment has a first insulating film 402a containing silicon and oxygen, a second insulating film 402b formed on the surface of the first insulating film 402a and containing silicon, nitrogen, and a predetermined element selected from hydrogen, deuterium, and halogen, and a third insulating film 402c formed on the surface of the second insulating film 402b and containing silicon and oxygen. Specifically, the tunnel insulating film 402 has the first insulating film 402a formed of a silicon oxide film and having a thickness of about 1 to 2 nm, the second insulating film 402b formed of a silicon nitride film containing at least one element selected from deuterium, hydrogen, fluorine, and chlorine and having a thickness of about 1 to 3 nm, and the third insulating film 402c formed of a silicon oxide film and having a thickness of about 1 to 4 nm.

The predetermined element (deuterium, hydrogen, fluorine, or chlorine) in the second insulating film 402b, a part of the tunnel insulating film 402, has a higher concentration than that in a charge-storage insulating film 403.

FIGS. 48A to 48D are diagrams of the distribution of the concentration of the predetermined element (deuterium, hydrogen, fluorine, or chlorine) in the tunnel insulating film 402 and the charge-storage insulating film 403. As shown in FIGS. 48A to 48D, regardless of the form of the distribution of the oxygen concentration, the effects of the present embodiment are exerted provided that the oxygen in the second insulating film 402b is higher than that in the charge-storage insulating film 403.

The tunnel insulating film 402 configured as described above enables effects similar to those described in the second embodiment to be exerted.

A component material similar to that described in the second embodiment can be used for the tunnel insulating film 402.

Now, a method for manufacturing the tunnel insulating film 402 corresponding to the second embodiment will be described.

First, as shown in FIGS. 49A and 49B, a silicon oxide film having a thickness of about 1.0 to 3.0 nm and serving as the third insulating film 402c is deposited on the exposed surface of the charge-storage insulating film 403 using the ALD method at 450 to 600° C.

Figure 50B:
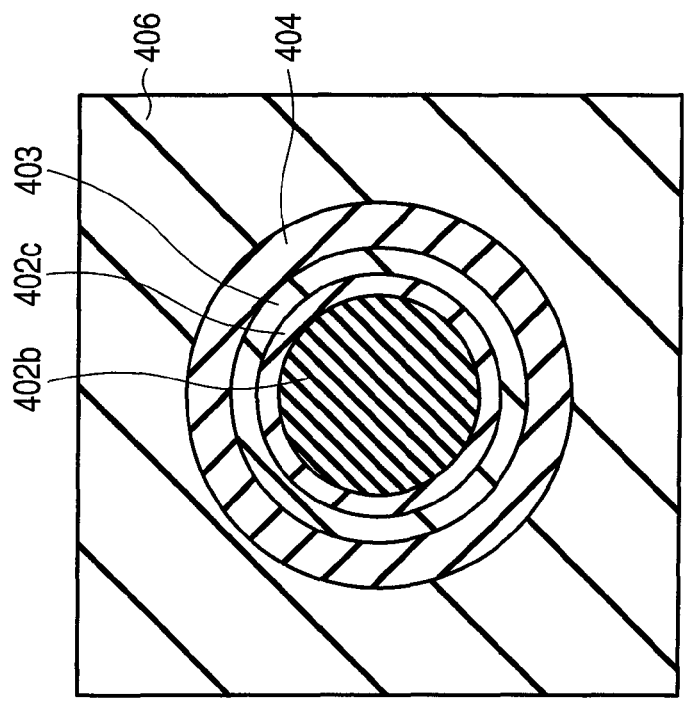
FIGS. 50A and 50B are diagrams schematically showing a part of the process of manufacturing the tunnel insulating film in the semiconductor device according to the fourth embodiment of the present invention.
Figure 50A:
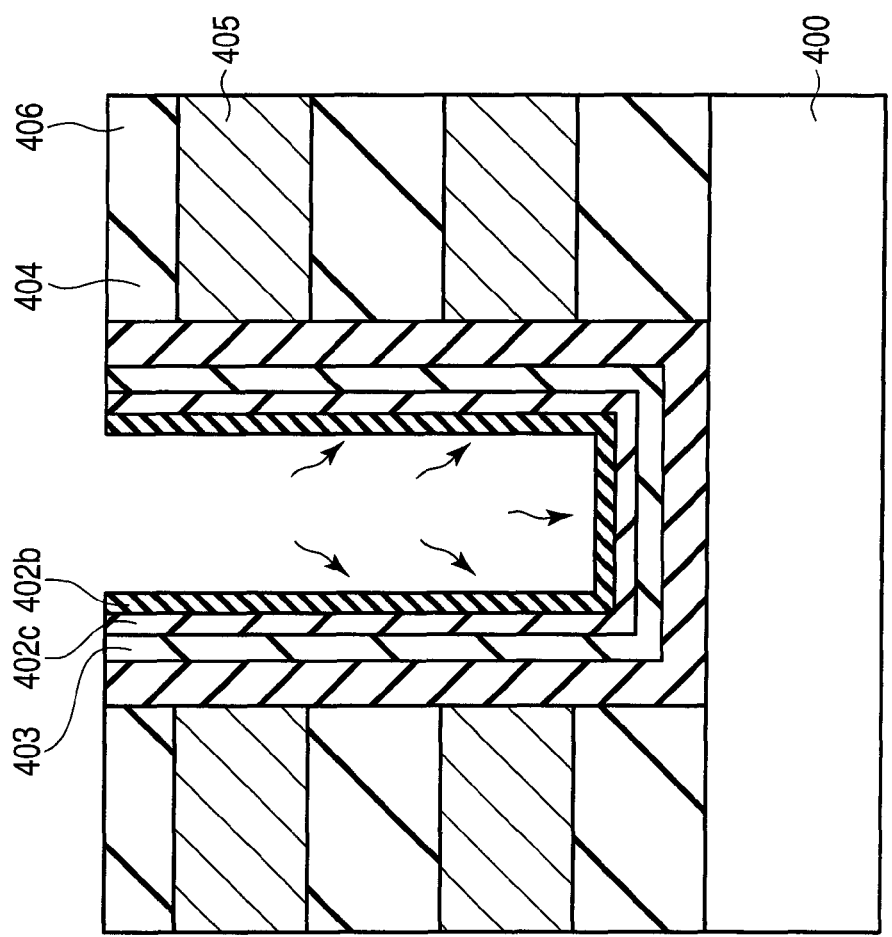

Then, as shown in FIGS. 50A and 50B, a silicon nitride film having a thickness of about 1.0 to 3.0 nm and serving as the second insulating film 402b is formed on the exposed surface of the third insulating film 402c using the ALD method at 450° C. or lower.

Figure 51A:
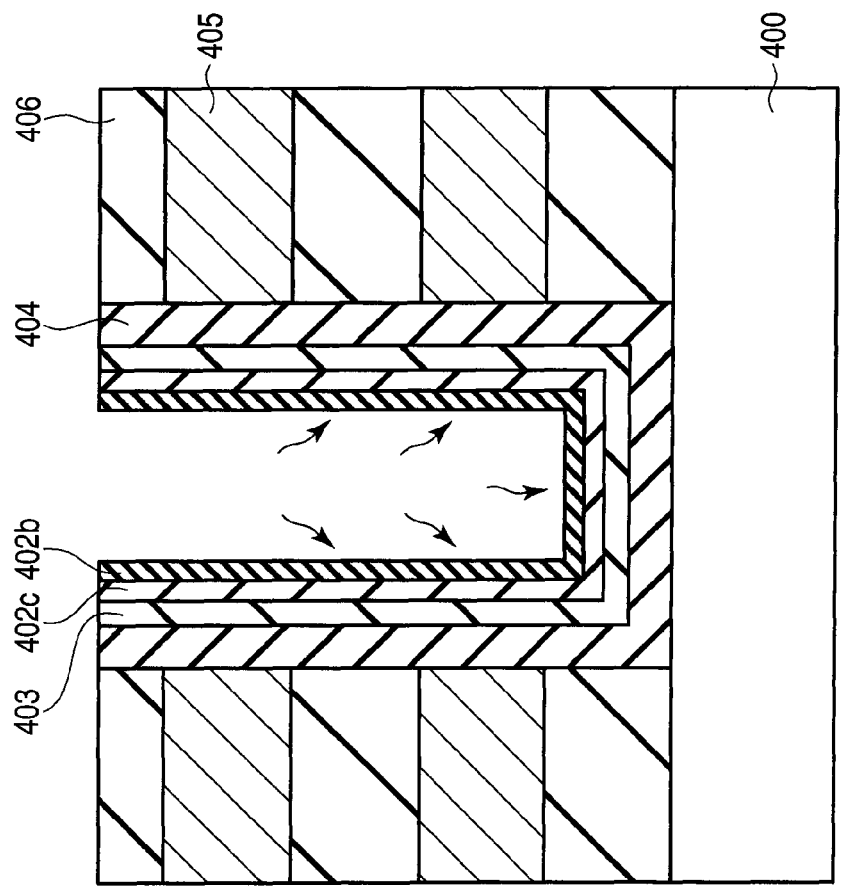
FIGS. 51A and 51B are diagrams schematically showing a part of the process of manufacturing the tunnel insulating film in the semiconductor device according to the fourth embodiment of the present invention.
Figure 51B:
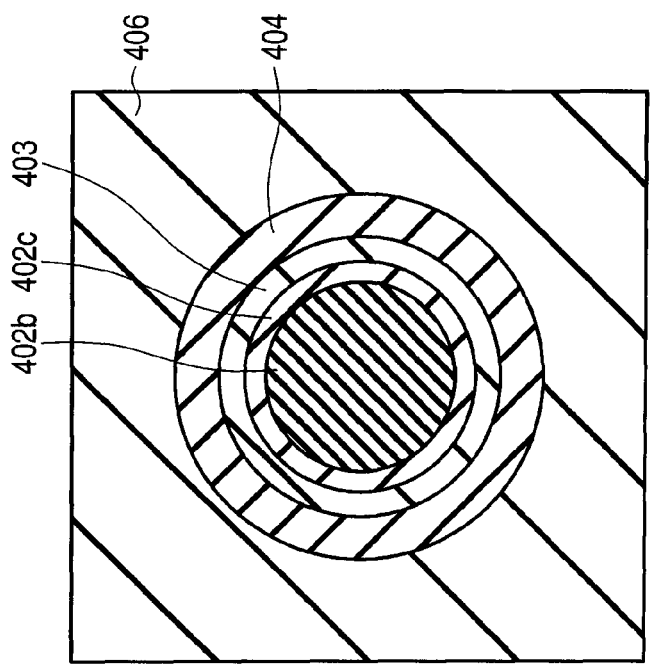

Then, as shown in FIGS. 51A and 51B, after the second insulating film 402b is formed, the above-described predetermined element is introduced. Specifically, the introduction is performed as follows.

To allow fluorine to be introduced, heat treatment is performed in an atmosphere containing fluorine at 400 to 700° C. Then, the fluorine can be introduced into the second insulating film 402b and into the interface between the third insulating film 402c and the second insulating film 402b.

To allow deuterium or hydrogen to be introduced, heat treatment is performed in an atmosphere containing fluorine at 400 to 600° C. Then, the deuterium or hydrogen can be introduced into the second insulating film 402b and into the interface between the third insulating film 402c and the second insulating film 402b.

Then, as shown in FIGS. 40A and 40B, a silicon nitride film having a thickness of about 1.0 to 2.5 nm and serving as the first insulating film 402a is formed using the ALD method.

Thus, the tunnel insulating film 402 is formed which is similar to the tunnel insulating film 203 according to the second embodiment.

Forming the tunnel insulating film 402 as described above enables effects similar to those described in the second embodiment to be exerted.

Now, with reference to FIGS. 40A, 40B, and 52A to 54B, the application of such a variation of the tunnel insulating film as described for the modification of the second embodiment to the tunnel insulating film according to the present embodiment will be described.

FIGS. 52A to 54A are sectional views schematically showing a basic method for manufacturing a tunnel insulating film in a semiconductor device according to the present embodiment. FIGS. 52B to 54B are plan views schematically showing the basic method for manufacturing the tunnel insulating film in the semiconductor device according to the present embodiment.

Figure 52B:
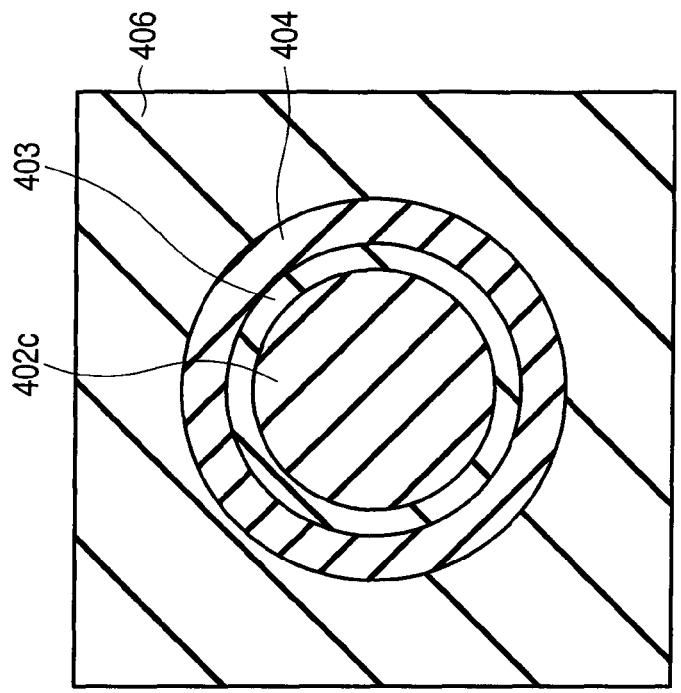
FIGS. 52A and 52B are diagrams schematically showing a part of the process of manufacturing the tunnel insulating film in the semiconductor device according to the fourth embodiment of the present invention.
Figure 52A:
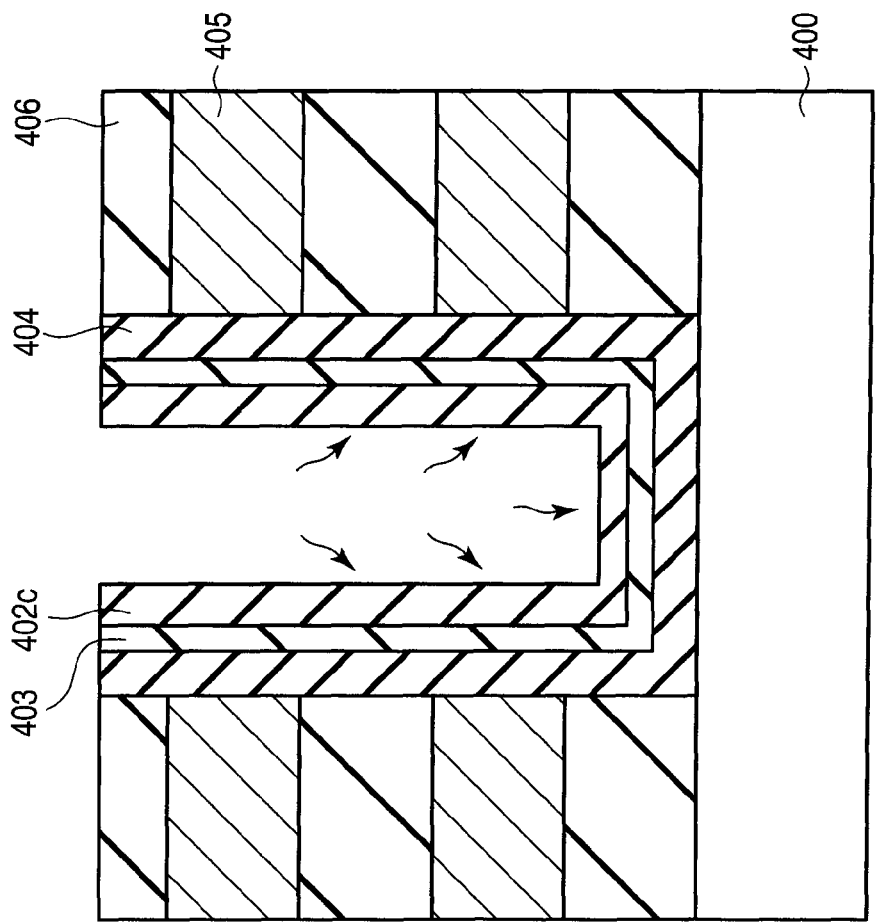

First, as shown in FIGS. 52A and 52B, a silicon oxide film having a thickness of about 2.0 to 6.0 nm and serving as the third insulating film 402c is deposited using the ALD method at 450 to 600° C. Nitrogen is subsequently introduced into the exposed surface portion of the silicon oxide film 402c by the plasma or radical nitriding method.

Thus, as shown in FIGS. 53A and 53B, a silicon oxynitride film having a thickness of about 1.0 to 3.0 nm and serving as the second insulating film 402b is formed. As a result, the exposed surface portion of the silicon oxide film 402c is reformed into a silicon oxynitride film containing a large amount of oxygen and in which a reduced number of charges are trapped. The second insulating film 402b may additionally be subjected to heat treatment in an atmosphere containing steam at 400 to 700° C. to introduce oxygen into the second insulating film 402b.

Then, as shown in FIGS. 54A and 54B, after the second insulating film 402b is formed, the above-described predetermined element is introduced. Specifically, the introduction is performed as follows.

To allow fluorine to be introduced, heat treatment is performed in an atmosphere containing fluorine at 400 to 700° C. Then, the fluorine can be introduced into the second insulating film 402b and into the interface between the third insulating film 402c and the second insulating film 402b.

To allow deuterium or hydrogen to be introduced, heat treatment is performed in an atmosphere containing fluorine at 400 to 600° C. Then, the deuterium or hydrogen can be introduced into the second insulating film 402b and into the interface between the third insulating film 402c and the second insulating film 402b.

Then, as shown in FIGS. 40A and 40B, a silicon nitride film having a thickness of about 1.0 to 2.5 nm and serving as the first insulating film 402a is formed using the ALD method.

Thus, the tunnel insulating film 402 is formed which is similar to the tunnel insulating film 203 according to the second embodiment.

Forming the tunnel insulating film 402 as described above enables effects similar to those described in the modification of the second embodiment to be exerted.

Now, with reference to FIGS. 37A, 37B, 40A, 40B, and 55A to 56B, the application of such a tunnel insulating film as described in the third embodiment to the tunnel insulating film according to the present embodiment will be described.

FIGS. 55A and 56A are sectional views schematically showing a basic method for manufacturing a tunnel insulating film in a semiconductor device according to the present embodiment. FIGS. 55B and 56B are plan views schematically showing the basic method for manufacturing the tunnel insulating film in the semiconductor device according to the present embodiment.

As shown in FIGS. 37A and 37B, as is the case with FIG. 31 for the third embodiment, a tunnel insulating film 402 according to the present embodiment has a first insulating film 402a containing silicon and oxygen, a second insulating film 402b formed on the surface of the first insulating film 402a and containing silicon and nitrogen, and a third insulating film 402c formed on the surface of the second insulating film 402b and containing silicon and oxygen. Specifically, the tunnel insulating film 402 has the first insulating film 402a formed of a silicon oxide film and having a thickness of about 1 to 2 nm, the second insulating film 402b formed of a silicon nitride film and having a thickness of about 1 to 3 nm, and the third insulating film 402c formed of a silicon oxide film and having a thickness of about 1 to 4 nm.

In the tunnel insulating film 402, the second insulating film 402b has a lower Si concentration than the charge-storage insulating film 403. That is, the second insulating film 402b is formed of a silicon nitride film with a low Si composition ratio. This enables a sufficient reduction in the charge trap state density of the second insulating film 402b. The charge-storage insulating film 403 is formed of a silicon nitride film with a high Si composition ratio. Thus, the charge-storage insulating film 403 has a high charge trap state density and can thus reliably store charges.

The tunnel insulating film 402 configured as described above enables effects similar to those described in the third embodiment to be exerted.

A component material similar to that described in the third embodiment can be used for the tunnel insulating film 402.

Now, a method for manufacturing the tunnel insulating film 402 corresponding to the third embodiment will be described.

First, as shown in FIGS. 55A and 55B, a silicon oxide film having a thickness of about 1.0 to 3.0 nm and serving as the third insulating film 402c is deposited using the ALD method at 450 to 600° C.

Then, as shown in FIGS. 56A and 56B, a silicon nitride film with a very low charge trap state density is deposited by using the ALD method at a temperature of 300 to 400° C. and alternately supplying DCS and $N_2^*$ ($N_2$ radicals). In place of $N_2^*$, $N^*$ (N radicals) or $NH^*$ (NH radicals) may be used. In the above-described manner, the silicon nitride film (second insulating film) 402b with the very low trap density is formed on the third insulating film 402c. The silicon nitride film 402b thus formed has a higher nitrogen ratio and a lower silicon ratio than common silicon nitride films.

Then, as shown in FIGS. 40A and 40B, a silicon nitride film having a thickness of about 1.0 to 2.5 nm and serving as the first insulating film 402a is formed using the ALD method.

Thus, the tunnel insulating film 402 is formed which is similar to the tunnel insulating film 303 according to the third embodiment.

Forming the tunnel insulating film 402 as described above enables effects similar to those described in the third embodiment to be exerted.

In the above-described embodiments, the memory cell has the source/drain diffusion layer. However, the above-described embodiments exert similar effects on a memory cell without a source/drain diffusion layer, that is, what is called a depression memory cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor region;
   a tunnel insulating film formed on a surface of the semiconductor region;
   a charge-storage insulating film formed on a surface of the tunnel insulating film and containing silicon and nitrogen;
   a block insulating film formed on a surface of the charge-storage insulating film; and
   a control gate electrode formed on a surface of the block insulating film,
   wherein
      the tunnel insulating film has a first insulating film formed on the surface of the semiconductor region and containing silicon and oxygen, a second insulating film formed on a surface of the first insulating film, and a third insulating film formed on a surface of the second insulating film and containing silicon and oxygen,
      the second insulating film contains silicon, nitrogen, and oxygen, and has a higher oxygen concentration than the charge-storage insulating film, and the oxygen in a central portion of the second insulating film has a higher concentration than the oxygen in a vicinity of an interface between the first insulating film and the second insulating film and the oxygen in a vicinity of an interface between the second insulating film and the third insulating film.

* * * * *